(12) United States Patent
Shin et al.

(10) Patent No.: US 11,009,753 B2
(45) Date of Patent: May 18, 2021

(54) DISPLAY DEVICE

(71) Applicant: Samsung Display Co., Ltd., Yongin-si (KR)

(72) Inventors: Cheol Shin, Hwaseong-si (KR); Hak Sun Chang, Yongin-si (KR); Se Hyun Lee, Hwaseong-si (KR); Seung Min Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/704,783

(22) Filed: Dec. 5, 2019

(65) Prior Publication Data

US 2020/0110318 A1    Apr. 9, 2020

Related U.S. Application Data

(62) Division of application No. 15/870,196, filed on Jan. 12, 2018, now Pat. No. 10,551,689.

(30) Foreign Application Priority Data

Jun. 28, 2017    (KR) .......................... 10-2017-0081934

(51) Int. Cl.
*G02F 1/1343* (2006.01)
*H01L 27/12* (2006.01)
*G02F 1/1368* (2006.01)
*G02F 1/1337* (2006.01)

(52) U.S. Cl.
CPC ...... *G02F 1/134309* (2013.01); *G02F 1/1368* (2013.01); *G02F 1/133707* (2013.01); *H01L 27/124* (2013.01); *G02F 1/134345* (2021.01); *G02F 2201/122* (2013.01); *G02F 2201/123* (2013.01)

(58) Field of Classification Search
CPC ............ G02F 1/134309; G02F 1/1368; G02F 2201/123; G02F 2201/122; H01L 27/124
See application file for complete search history.

(56) References Cited

U.S. PATENT DOCUMENTS

| 8,760,607 B2 | 6/2014 | Kye et al. | |
| 2010/0053526 A1* | 3/2010 | Kye | G02F 1/133753 349/124 |
| 2013/0194536 A1* | 8/2013 | Tae | G02F 1/134309 349/143 |

FOREIGN PATENT DOCUMENTS

| KR | 1020130101325 A | 9/2013 |
| KR | 1020130125638 A | 11/2013 |
| KR | 1020160137756 A | 12/2016 |

* cited by examiner

*Primary Examiner* — Fernando L Toledo
*Assistant Examiner* — Adam S Bowen
(74) *Attorney, Agent, or Firm* — Cantor Colburn LLP

(57) ABSTRACT

A display device includes a substrate, a first wiring and a second wiring positioned on the substrate, a thin film transistor ("TFT") connected to the first wiring and the second wiring, and a pixel electrode connected to the TFT and including a transverse branch part, a longitudinal branch part, minute branches extending from the transverse branch part and the longitudinal branch part, and an outer branch part connecting end parts of the minute branches and adjacent to the storage electrode line, where a shortest distance from a center part of at least one side of the outer branch part to at least one side of the first wiring is different from a shortest distance from an edge part of at least one side of the outer branch part to at least one side of the first wiring.

24 Claims, 38 Drawing Sheets

DISPLAY DEVICE

This application is a divisional of U.S. patent application Ser. No. 15/870,196, filed on Jan. 12, 2018, which claims priority to Korean Patent Application No. 10-2017-0081934, filed on Jun. 28, 2017, and all the benefits accruing therefrom under 35 U.S.C. § 119, the content of which in its entirety is herein incorporated by reference.

BACKGROUND

(a) Field

Exemplary embodiments of the invention relate to a display device.

(b) Description of the Related Art

A liquid crystal display ("LCD") is one of the most widely used flat panel displays, and the LCD generally includes a pair of panels provided with field-generating electrodes, such as pixel electrodes and a common electrode, and a liquid crystal ("LC") layer interposed between the pair of panels. The LCD displays images by applying voltages, respectively, to the field-generating electrodes to generate an electric field in the LC layer that determines orientations of LC molecules therein to adjust polarization of incident light.

The LCD may include a vertical alignment ("VA") mode LCD, which aligns LC molecules such that long axes of the LC molecules are perpendicular to the pair of panels when an electric field is not generated, has been developed.

In the VA mode LCD, it is important to ensure a wide viewing angle, and for this purpose, a method for implementing a multi-domain by dividing one pixel into a plurality of domains and differentiating a direction in which the LCs are inclined in each domain has been researched. In each domain, a plurality of minute branches extends in different directions from each other, and inclination of the LC is determined by an extending direction of the plurality of minute branches.

SUMMARY

Ends of minute branches located at an edge of each pixel have a relatively weak force to control a liquid crystal ("LC"), accordingly there is a problem that the ends may cause an undesired texture issue.

Exemplary embodiments provide a display device in which generation of the texture is prevented by improving a control force of the LC on the edge of the pixel.

A display device according to an exemplary embodiment includes a substrate, a first wiring and a second wiring positioned on the substrate, a thin film transistor ("TFT") connected to the first wiring and the second wiring, and a pixel electrode connected to the TFT, where the pixel electrode includes a transverse branch part, a longitudinal branch part, minute branches extending from the transverse branch part and the longitudinal branch part, and an outer branch part connecting end parts of the minute branches and adjacent to the storage electrode line, and where a shortest distance from a center part of at least one side of the outer branch part to at least one side of the first wiring is different from a shortest distance from an edge part of at least one side of the outer branch part to at least one side of the first wiring.

The display device according to an exemplary embodiment further includes a storage electrode line adjacent to the outer branch part of the pixel electrode, and the shortest distance from the center part of at least one side of the outer branch part to at least one side of the storage electrode line may be different from the shortest distance from the edge part of at least one side of the outer branch part to at least one side of the storage electrode line.

In an exemplary embodiment, the storage electrode line may overlap the first wiring and extends in a direction parallel to the first wiring.

In an exemplary embodiment, the TFT may include a gate electrode, a source electrode, and a drain electrode, the first wiring may be a gate line connected to the gate electrode, and the second wiring may be a data line connected to the source electrode.

In an exemplary embodiment, the TFT may include a gate electrode, a source electrode, and a drain electrode, the first wiring may be a data line connected to the source electrode, and the second wiring may be a gate line connected to the gate electrode.

In an exemplary embodiment, a width of the storage electrode line may be uniform, and a width of the outer branch part may gradually decrease from a center part of the outer branch part toward an edge part of the outer branch part.

In an exemplary embodiment, the outer branch part may include a first side adjacent to the storage electrode line and a second side connected to the minute branches, and a distance between the first side of the outer branch part and the storage electrode line may gradually increase from the center part of the outer branch part toward the edge part of the outer branch part.

In an exemplary embodiment, a distance between the second side of the outer branch part and the storage electrode line may be uniform.

In an exemplary embodiment, the distance between the second side of the outer branch part and the storage electrode line may gradually decrease from the center part of the outer branch part toward the edge part of the outer branch part.

In an exemplary embodiment, the outer branch part may include a first side adjacent to the storage electrode line and a second side connected to the minute branches, and a distance between the second side of the outer branch part and the storage electrode line may gradually decrease from the center part of the outer branch part toward the edge part of the outer branch part.

In an exemplary embodiment, a distance between the first side of the outer branch part and the storage electrode line may be uniform.

In an exemplary embodiment, a dummy branch part positioned between the outer branch part and the storage electrode line may be further included, a width of the dummy branch part may be uniform, and the dummy branch part and the outer branch part may be extended to be parallel.

In an exemplary embodiment, the outer branch part may include a first side adjacent to the storage electrode line and a second side connected to the minute branches, and a distance between the first side of the outer branch part and the storage electrode line may gradually increase from the center part of the outer branch part toward the edge part of the outer branch part.

In an exemplary embodiment, the distance between the second side of the outer branch part and the storage electrode line may be uniform.

In an exemplary embodiment, the distance between the second side of the outer branch part and the storage electrode line may gradually decrease from the center part of the outer branch part toward the edge part of the outer branch part.

In an exemplary embodiment, the outer branch part may include a first side adjacent to the storage electrode line and a second side connected to the minute branches, and the distance between the second side of the outer branch part and the storage electrode line may gradually decrease from the center part of the outer branch part toward the edge part of the outer branch part.

In an exemplary embodiment, the distance between the first side of the outer branch part and the storage electrode line may be uniform.

In an exemplary embodiment, the width of the storage electrode line may gradually increase from the center part of the storage electrode line toward the edge part of the storage electrode line.

In an exemplary embodiment, the width of the outer branch part may gradually decrease from the center part of the outer branch part toward the edge part of the outer branch part.

In an exemplary embodiment, the distance between the outer branch part and the storage electrode line may be uniform.

In an exemplary embodiment, the width of the outer branch part may be uniform, and the width of the storage electrode line may gradually increase from the center part of the storage electrode line toward the edge part of the storage electrode line.

In an exemplary embodiment, the distance between the outer branch part and the storage electrode line may be uniform.

In an exemplary embodiment, the width of the outer branch part may be uniform, and the width of the storage electrode line may be uniform.

In an exemplary embodiment, the distance between the outer branch part and the storage electrode line may gradually increase from the center part of the outer branch part toward the edge part of the outer branch part.

A display device according to an exemplary embodiment includes a substrate, a first wiring and a second wiring positioned on the substrate, a TFT connected to the first wiring and the second wiring, and a pixel electrode connected to the TFT, where the pixel electrode includes a transverse branch part, a longitudinal branch part, minute branches extending from the transverse branch part and the longitudinal branch part, an outer branch part connecting end parts of the minute branches and adjacent to the storage electrode line, and a dummy branch part positioned between the outer branch part and the storage electrode line, and where a shortest distance from a center part of at least one side of the dummy branch part to at least one side of the first wiring is different from a shortest distance from an edge part of at least one side of the dummy branch part to at least one side of the first wiring.

In an exemplary embodiment, the display device according to an exemplary embodiment may further include a storage electrode line adjacent to the outer branch part of the pixel electrode, and the shortest distance from the center part of at least one side of the dummy branch part to at least one side of the storage electrode line is different from the shortest distance from the edge of at least one side of the dummy branch part to at least one side of the storage electrode line.

In an exemplary embodiment, the storage electrode line may overlap the first wiring and may be elongated in a direction parallel to the first wiring.

In an exemplary embodiment, the TFT may include a gate electrode, a source electrode, and a drain electrode, the first wiring may be a gate line connected to the gate electrode, and the second wiring may be a data line connected to the source electrode.

In an exemplary embodiment, the TFT may include a gate electrode, a source electrode, and a drain electrode, the first wiring may be a data line connected to the source electrode, and the second wiring may be a gate line connected to the gate electrode.

In an exemplary embodiment, a width of the storage electrode line may be uniform, and a width of the dummy branch part may gradually decrease from the center part of the dummy branch part toward the edge part of the dummy branch part.

In an exemplary embodiment, the dummy branch part may include a first side adjacent to the storage electrode line and a second side facing the first side, and a distance between the first side of the dummy branch part and the storage electrode line may gradually increase from the center part of the dummy branch part toward the edge part of the dummy branch part.

In an exemplary embodiment, a distance between the second side of the dummy branch part and the storage electrode line may be uniform.

In an exemplary embodiment, a distance between the second side of the dummy branch part and the storage electrode line may gradually decrease from the center part of the dummy branch part toward the edge part of the dummy branch part.

In an exemplary embodiment, the dummy branch part may include a first side adjacent to the storage electrode line and a second side facing the first side, and the distance between the second side of the dummy branch part and the storage electrode line may gradually decrease from the center part of the dummy branch part toward the edge part of the dummy branch part.

In an exemplary embodiment, the distance between the first side of the dummy branch part and the storage electrode line may be uniform.

In an exemplary embodiment, the width of the storage electrode line may gradually increase from the center part of the storage electrode line toward the edge part of the storage electrode line.

In an exemplary embodiment, the width of the dummy branch part may be uniform, and the width of the outer branch part may gradually decrease from the center part of the outer branch part toward the edge part of the outer branch part.

In an exemplary embodiment, the distance between the dummy branch part and the storage electrode line may be uniform, and the distance between the dummy branch part and the outer branch part may be uniform.

In an exemplary embodiment, the width of the dummy branch part may be uniform, the width of the outer branch part may be uniform, and the width of the storage electrode line may gradually increase from the center part of the storage electrode line toward the edge part of the storage electrode line.

In an exemplary embodiment, the distance between the dummy branch part and the storage electrode line may be uniform, and the distance between the dummy branch part and the outer branch part may be uniform.

In an exemplary embodiment, the width of the dummy branch part may be uniform, the width of the outer branch part may be uniform, and the width of the storage electrode line may be uniform.

In an exemplary embodiment, the distance between the dummy branch part and the storage electrode line may gradually increase from the center part of the dummy branch part toward the edge part of the dummy branch part.

In an exemplary embodiment, the distance between the dummy branch part and the outer branch part may be uniform.

A display device according to an exemplary embodiment includes a substrate, a first wiring and a second wiring positioned on the substrate, a TFT connected to the first wiring and the second wiring, and a pixel electrode connected to the TFT, where the pixel electrode includes a transverse branch part, a longitudinal branch part, a plurality of minute branches extending from the transverse branch part and the longitudinal branch part, and an outer branch part connecting a portion of end parts among the plurality of minute branches and adjacent to the first wiring, and a remaining of the parts among the plurality of minute branches is not connected to the outer branch part.

In an exemplary embodiment, the display device according to an exemplary embodiment may further include a storage electrode line adjacent to the outer branch part of the pixel electrode.

In an exemplary embodiment, the storage electrode line may overlap the first wiring and may be elongated in a direction parallel to the first wiring.

In an exemplary embodiment, the TFT may include a gate electrode, a source electrode, and a drain electrode, the first wiring may be a gate line connected to the gate electrode, and the second wiring may be a data line connected to the source electrode.

In an exemplary embodiment, the TFT may include a gate electrode, a source electrode, and a drain electrode, the first wiring may be a data line connected to the source electrode, and the second wiring may be a gate line connected to the gate electrode.

In an exemplary embodiment, the outer branch part may be connected to the plurality of minute branches adjacent to the longitudinal branch part.

In an exemplary embodiment, a dummy branch part positioned between the outer branch part and the storage electrode line may be further included.

In an exemplary embodiment, the outer branch part may be connected to the plurality of minute branches adjacent to the longitudinal branch part.

In an exemplary embodiment, the dummy branch part may be connected to the plurality of minute branches adjacent to the longitudinal branch part, and the outer branch part may be connected to the plurality of minute branches that are not connected to the dummy branch part.

In an exemplary embodiment, a shortest distance from the center part of at least one side of the outer branch part to at least one side of the storage electrode line may be different from a shortest distance from the edge part of at least one side of the outer branch part to at least one side of the storage electrode line.

In an exemplary embodiment, a dummy branch part positioned between the outer branch part and the storage electrode line may be further included, and the shortest distance from the center part of at least one side of the dummy branch part to at least one side of the storage electrode line may be different from the shortest distance from the edge part of at least one side of the dummy branch part to at least one side of the storage electrode line.

In an exemplary embodiment, a display device according to an exemplary embodiment includes a substrate, a first wiring and a second wiring positioned on the substrate, a TFT connected to the first wiring and the second wiring, and a pixel electrode connected to the TFT, where the pixel electrode includes a transverse branch part, a longitudinal branch part, minute branches extending from the transverse branch part and the longitudinal branch part, and an outer branch part connecting end parts of the minute branches and adjacent to the first wiring, and where a width of a center part of the transverse branch part is different from a width of the edge part of the transverse branch part.

In an exemplary embodiment, the display device according to an exemplary embodiment may further include a storage electrode line adjacent to the outer branch part of the pixel electrode.

In an exemplary embodiment, the storage electrode line may overlap the first wiring and may be elongated in a direction parallel to the first wiring.

In an exemplary embodiment, the TFT may include a gate electrode, a source electrode, and a drain electrode, the first wiring may be a gate line connected to the gate electrode, and the second wiring may be a data line connected to the source electrode.

In an exemplary embodiment, the TFT may include a gate electrode, a source electrode, and a drain electrode, the first wiring may be a data line connected to the source electrode, and the second wiring may be a gate line connected to the gate electrode.

In an exemplary embodiment, the width of the transverse branch part may gradually decrease from the center part of the transverse branch part toward the edge part of the transverse branch part.

In an exemplary embodiment, the width of the longitudinal branch part may gradually decrease from the center part of the longitudinal branch part toward the edge part of the longitudinal branch part.

In an exemplary embodiment, the width of the longitudinal branch part may gradually decrease from the center part of the longitudinal branch part toward the edge part of the longitudinal branch part.

In an exemplary embodiment, the width of the transverse branch part may gradually decrease from the center part of the transverse branch part to a region positioned between the center part and the edge part of the transverse branch part.

In an exemplary embodiment, the width of the longitudinal branch part may gradually decrease from the center part of the longitudinal branch part to a region positioned between the center part and the edge part of the longitudinal branch part.

In an exemplary embodiment, a width of the longitudinal branch part may gradually decrease from the center part of the longitudinal branch part to a region positioned between the center part and the edge part of the longitudinal branch part.

In an exemplary embodiment, a shortest distance from the center part of at least one side of the outer branch part to at least one side of the storage electrode line may be different from a shortest distance from the edge part of at least one side of the outer branch part to at least one side of the storage electrode line.

In an exemplary embodiment, a dummy branch part positioned between the outer branch part and the storage electrode line may be further included, and the shortest distance from the center part of at least one side of the dummy branch part to at least one side of the storage electrode line may be different from the shortest distance from the edge part of at least one side of the dummy branch part to at least one side of the storage electrode line.

According to exemplary embodiments, as the control force of the LC may be improved on the edge of the pixel, the generation of the texture may be prevented.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
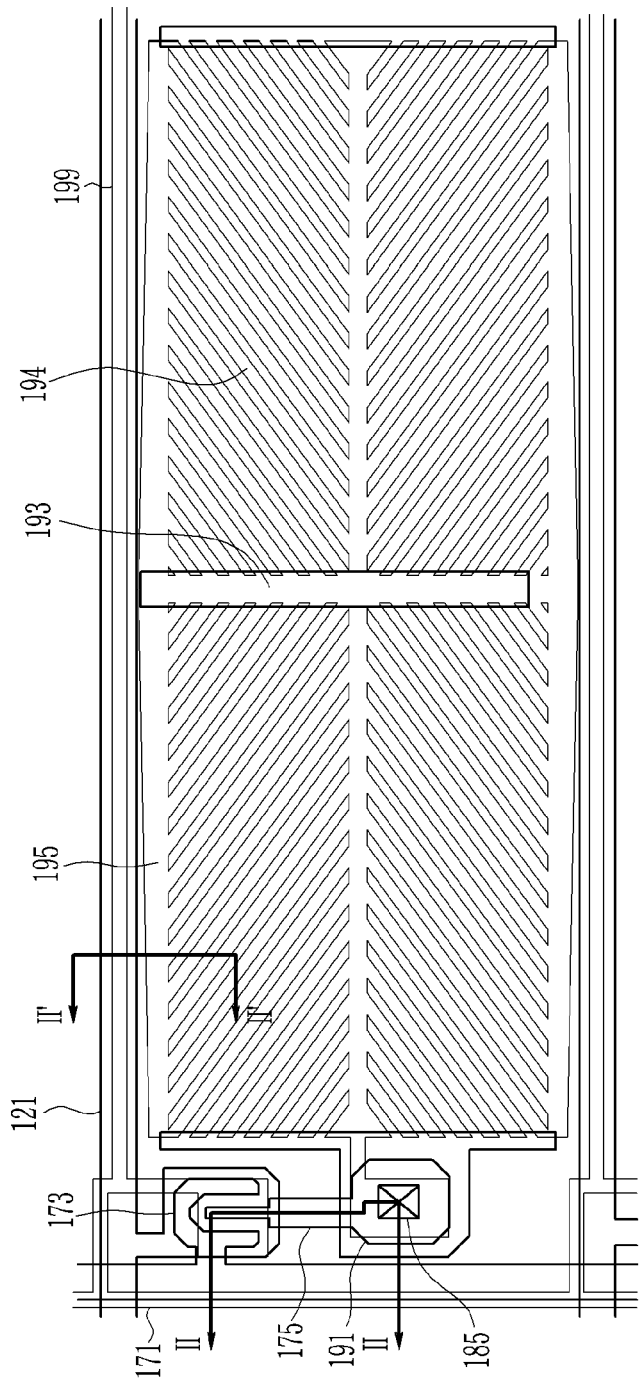
FIG. 1 is a plan view of an exemplary embodiment of a display device.

The exemplary embodiments will be described more fully hereinafter with reference to the accompanying drawings. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

In the drawings, size and thickness of each element are arbitrarily illustrated for convenience of description, and the invention is not necessarily limited to as illustrated in the drawings. In the drawings, the thickness of layers, films, panels, regions, etc., are exaggerated for clarity. In the drawings, the thicknesses of layers and regions are exaggerated for convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Now, a display device according to an exemplary embodiment will be described with reference to FIGS. 1 and 2 as well as other accompanying drawings.

Figure 2:
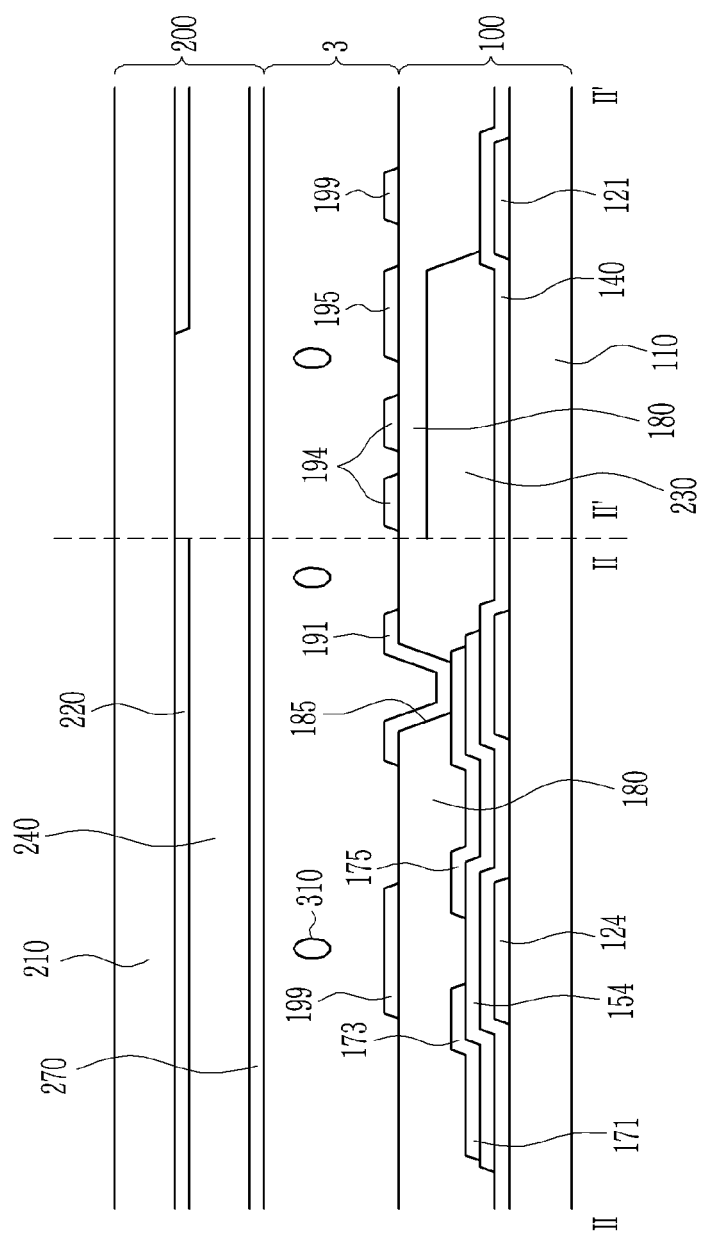
FIG. 2 is a cross-sectional view taken along lines II-II and II'-II' of FIG. 1.

FIG. 1 is a plan view of a display device according to an exemplary embodiment, and FIG. 2 is a cross-sectional view taken along lines II-II and II'-II' of FIG. 1.

As shown in FIGS. 1 and 2, the display device according to an exemplary embodiment includes a lower panel 100 and an upper panel 200 facing each other, and a liquid crystal ("LC") layer 3 interposed between two display panels 100 and 200.

First, the lower panel 100 will be described.

In an exemplary embodiment, a gate line 121 and a gate electrode 124 protruded from the gate line 121 are positioned on an insulation substrate 110 including transparent glass or plastic, for example.

The gate line 121 transfers a gate signal and mainly extends in a longitudinal direction. The gate electrode 124 is protruded downward from the gate line 121 on a plane, but the invention is not limited thereto. An extending direction of the gate line 121, the protruded direction of the gate electrode 124, and shapes thereof may be variously changed. The gate line 121 and the gate electrode 124 may include a low resistance metal material. The gate line 121 and the gate electrode 124 are positioned in the same layer and may be provided as a single layer or a multilayer.

A gate insulating layer 140 is positioned on the gate line 121 and the gate electrode 124. In an exemplary embodiment, the gate insulating layer 140 may include an inorganic insulating material such as a silicon nitride ($SiN_x$), a silicon oxide ($SiO_x$), etc.

A semiconductor layer 154 is positioned on the gate insulating layer 140. The semiconductor layer 154 overlaps the gate electrode 124. In an exemplary embodiment, the semiconductor layer 154 may include amorphous silicon, polycrystalline silicon, a metal oxide, etc., for example.

An ohmic contact (not shown) may be further positioned on the semiconductor layer 154. In an exemplary embodiment, the ohmic contacts may include a material such as n+ hydrogenated amorphous silicon in which an n-type impurity is doped with a high concentration, or of a silicide.

A data line 171, a source electrode 173 protruded from the data line 171, and a drain electrode 175 separated from the source electrode 173 are positioned on the semiconductor layer 154 and the gate insulating layer 140.

The data line 171 extends mainly in a longitudinal direction and transmits a data signal. The data line 171 may cross the gate line 121. The source electrode 173 is protruded from the data line 171 on the gate electrode 124. The source electrode 173 and the drain electrode 175 overlap the gate electrode 124. The source electrode 173 and the drain electrode 175 are separated from each other on the gate electrode 124. The source electrode 173 may be bent in a "U" shape. The drain electrode 175 includes one end portion that is large and one end portion that has a bar shape. The bar-shaped end of the drain electrode 175 may be enclosed by the source electrode 173. The extending direction of the data line 171, and the shape of the source electrode 173 and the drain electrode 175, may be variously changed. The data line 171, the source electrode 173, and the drain electrode 175 may include the low resistance metal material. The data line 171, the source electrode 173, and the drain electrode 175 are positioned in the same layer, and may be provided as the single layer or the multilayer.

The gate electrode 124, the source electrode 173, and the drain electrode 175 form one thin film transistor ("TFT") along with the semiconductor layer 154. In this case, a channel of the TFT is provided in the semiconductor layer 154 between the source electrode 173 and the drain electrode 175.

A passivation layer 180 is positioned on the data line 171, the source electrode 173, the drain electrode 175, and the semiconductor layer 154. The passivation layer 180 may include an organic insulating material or an inorganic insulating material, and may be provided as the single layer or the multilayer.

A contact hole 185 is defined in the passivation layer 180. The contact hole 185 overlaps at least part of the drain electrode 175. Particularly, the contact hole 185 may overlap the wide end of the drain electrode 175.

A color filter 230 may be positioned between the passivation layer 180 and the gate insulating layer 140. In an exemplary embodiment, the color filter 230 may display one among primary colors such as three primary colors of red, green, and blue. However, the color displayed by the color filter 230 is not limited to three primary colors of red, green, and blue, and one among cyan, magenta, yellow, and white-based colors may be displayed, for example.

However, the illustrated exemplary embodiment is not limited thereto, and the color filter 230 may be provided in the upper panel 200. In this case, the color filter 230 may be positioned between a substrate 210 and an overcoat 240.

A storage electrode line 199 and a pixel electrode 191 separated from the storage electrode line 199 are positioned on the passivation layer 180. In an exemplary embodiment, the storage electrode line 199 and the pixel electrode 191 may include a transparent metal oxide such as indium tin oxide ("ITO"), indium zinc oxide ("IZO"), etc. The storage electrode line 199 and the pixel electrode 191 may be positioned in the same layer.

The storage electrode line 199 extends in the transverse and longitudinal directions, and transmits a storage voltage. The storage electrode line 199 may overlap the gate line 121 and the data line 171.

The pixel electrode 191 may be physically and electrically connected to the drain electrode 175 through the contact hole 185. When the TFT is turned on, the pixel electrode 191 receives a data signal through the drain electrode 175.

Next, a shape of the pixel electrode 191 will be described in detail with reference to FIGS. 3 and 4.

Figure 3:
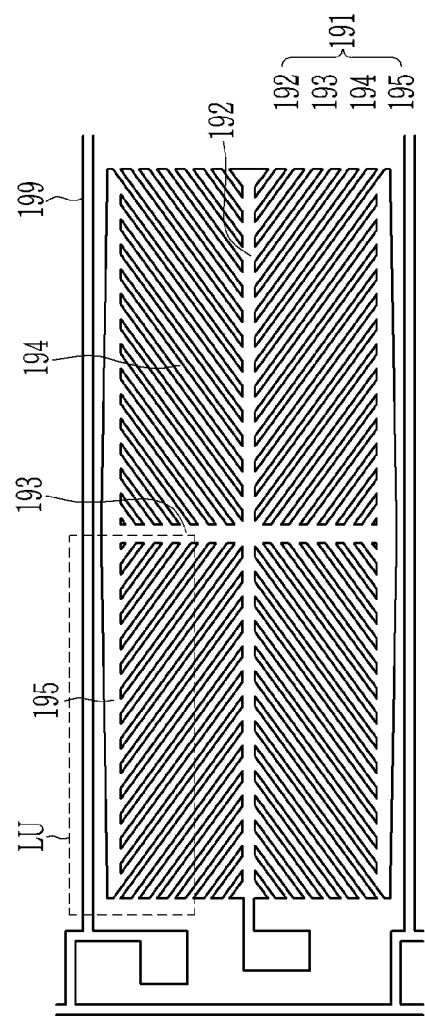
FIG. 3 is a plan view showing one layer of an exemplary embodiment of a display device.
Figure 4:
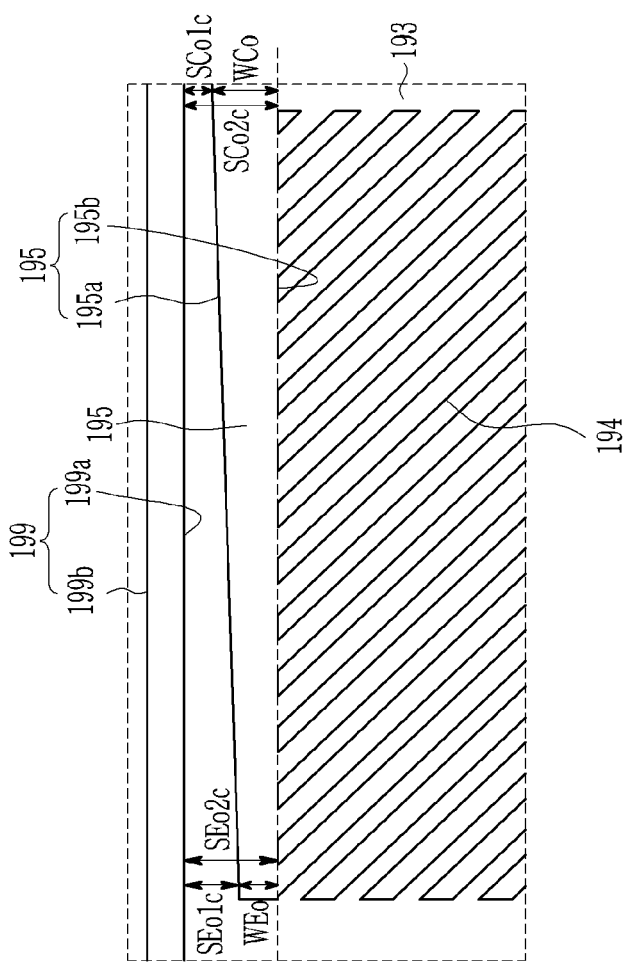
FIG. 4 is a plan view showing a partial region of FIG. 3.

FIG. 3 is a plan view showing any layer of a display device according to an exemplary embodiment, and FIG. 4 is a plan view showing a partial region of FIG. 3. FIG. 3 shows the electrode and the storage electrode line of the pixel of the display device according to an exemplary embodiment. FIG. 4 shows a part LU including a sub-region positioned at a left-upper side and the storage electrode line adjacent thereto among four sub-regions of the pixel electrode of the display device according to an exemplary embodiment.

The overall shape of the pixel electrode 191 is a quadrangle, and the pixel electrode 191 includes a transverse branch part 192 and a longitudinal branch part 193 crossing each other, and a minute branch part 194 extending from them.

The transverse branch part 192 may extend in a substantially transverse direction (e.g., horizontal direction in FIG. 3) and may be parallel to the gate line 121, and the longitudinal branch part 193 may extend in a substantially longitudinal direction (e.g., vertical direction in FIG. 3) and may be parallel to the data line 171. The pixel electrode 191 is divided into four sub-regions by the transverse branch part 192 and the longitudinal branch part 193.

The minute branch part 194 obliquely extends from the transverse branch part 192 and the longitudinal branch part 193, and the extending direction may form an angle of approximately 45 degrees or approximately 135 degrees with reference to the gate line 121 or the transverse branch part 192. Among four sub-regions, the minute branch part 194 obliquely extends in a left-upper direction from the transverse branch part 192 or the longitudinal branch part 193 in one sub-region, and the minute branch part 194 obliquely extends in a right-upper direction from the transverse branch part 192 or the longitudinal branch part 193 in another sub-region. Also, the minute branch part 194 obliquely extends in a left-lower direction from the transverse branch part 192 or the longitudinal branch part 193 in another sub-region, and the minute branch part 194 obliquely extends in a right-lower direction from the transverse branch part 192 or the longitudinal branch part 193 in the final sub-region. The extending directions of the minute branch parts 194 of two adjacent sub-regions may be crossed.

The pixel electrode 191 may further include an outer branch part 195 connecting end parts of the minute branch parts 194. The outer branch part 195 may mainly extend in the transverse direction. Accordingly, the outer branch part 195 may be positioned on an upper edge and a lower edge of the pixel electrode 191. However, the invention is not limited thereto, and the outer branch part 195 may be further positioned on a left edge and a right edge of the pixel electrode 191, while the outer branch part 195 positioned on the left edge and the right edge of the pixel electrode 191 may extend in the longitudinal direction.

The outer branch part 195 is adjacent to the storage electrode line 199 and is separated from the storage electrode line 199 by a predetermined interval. A distance from a center part of at least one side of the outer branch part 195 to at least one side of the storage electrode line 199 is different from a distance from an edge part of at least one side of the outer branch part 195 to at least one side of the storage electrode line 199. Also, the width of the outer branch part 195 is not uniform, and the width of the storage electrode line 199 is uniform along the transverse direction.

The outer branch part 195 includes a first side 195*a* adjacent to the storage electrode line 191 and a second side 195*b* facing the first side 195*a*. The second side 195*b* is connected to the minute branch part 194, and a boundary between the second side 195*b* and the minute branch part 194 is represented by an imaginary line. A position where the outer branch part 195 and the longitudinal branch part 193 meet may be the center part of the outer branch part 195. Also, the position farthest from the longitudinal branch part 193 along a transverse direction may be the edge part of the outer branch part 195. The width of the outer branch part 195 means the distance between the first side 195*a* and the second side 195*b*. The storage electrode line 199 includes the first side 199*a* adjacent to the outer branch part 195 and the second side 199*b* facing the first side 199*a*. The width of the storage electrode line 199 means the distance between the first side 199*a* and the second side 199*b*.

The distance SCo1$c$ from the center part of the first side 195*a* of the outer branch part 195 to the storage electrode line 199 is different from the distance SEo1$c$ from the edge part of the first side 195*a* of the outer branch part 195 to the storage electrode line 199. The distance SCo1$c$ from the center part of the first side 195*a* of the outer branch part 195 to the storage electrode line 199 means the shortest distance from the center part of the first side 195*a* of the outer branch part 195 to the first side 199*a* of the storage electrode line 199. The distance from the edge of the first side 195*a* of the outer branch part 195 to the storage electrode line 199 means the shortest distance from the edge of the first side 195*a* of the outer branch part 195 to the first side 199*a* of the storage electrode line 199. The distance SCo1$c$ from the center part of the first side 195*a* of the outer branch part 195 to the storage electrode line 199 is shorter than the distance SEo1$c$ from the edge part of the first side 195*a* of the outer branch part 195 to the storage electrode line 199. The distance between the first side 195*a* of the outer branch part 195 and the storage electrode line 199 gradually increases from the center part of the outer branch part 195 toward the edge part of the outer branch part 195. The first side 195a of the outer branch part 195 is provided with a shape that is inclined with respect to the storage electrode line 199.

The distance SCo2c from the center part of the second side 195b of the outer branch part 195 to the storage electrode line 199 is substantially the same as the distance SEo2c from the edge part of the second side 195b of the outer branch part 195 to the storage electrode line 199. The distance SCo2c from the center part of the second side 195b of the outer branch part 195 to the storage electrode line 199 means the shortest distance from the center part of the second side 195b of the outer branch part 195 to the first side 199a of the storage electrode line 199. The distance SEo2c from the edge of the second side 195b of the outer branch part 195 to the storage electrode line 199 means the shortest distance from the edge part of the second side 195b of the outer branch part 195 to the first side 199a of the storage electrode line 199. The distance between the second side 195b of the outer branch part 195 and the storage electrode line 199 is uniform along the transverse direction.

The width WCo of the center part of the outer branch part 195 is different from the width WEo of the edge part of the outer branch part 195. The width WCo of the center part of the outer branch part 195 is larger than the width WEo of the edge part of the outer branch part 195. The width of outer branch part 195 gradually decreases from the center part of the outer branch part 195 toward the edge part of the outer branch part 195.

In the illustrated exemplary embodiment, as the width of the outer branch part 195 is different depending on the position and one side of the outer branch part 195 has the shape that is inclined with respect to the storage electrode line 199, a transverse direction electric field (a lateral field) may be generated between the outer branch part 195 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with a shape that is approximately similar to that of the gate line 121. Accordingly, the shortest distance from the center part of at least one side of the outer branch part 195 to at least one side of the gate line 121 may be different from the shortest distance from the edge part of at least one side of the outer branch part 195 to at least one side of the gate line 121. In an exemplary embodiment, the distance from the center part of the first side 195a of the outer branch part 195 to the gate line 121 may be shorter than the distance from the edge part of the first side 195a of the outer branch part 195 to the gate line 121, for example. The distance between the first side 195a of the outer branch part 195 and the gate line 121 may gradually increase from the center part of the outer branch part 195 toward the edge part of the outer branch part 195.

Next, the upper panel 200 will be described.

A light blocking member 220 may be positioned on an insulation substrate 210 including the transparent glass or plastic. The light blocking member 220 may overlap the edge of the pixel electrode 191, the TFT, the gate line 121, and the data line 171.

The light blocking member 220 is referred to as a black matrix and prevents light leakage.

An overcoat 240 is positioned on the light blocking member 220. The overcoat 240 planarizes constituent elements positioned under the overcoat 240 and suppresses contamination of the LC layer 3 by the organic material flowing from the constituent elements, thereby preventing defects such as an afterimage that may be generated during driving.

A common electrode 270 is positioned on the overcoat 240. The common electrode 270 may be disposed on the entire surface of the substrate 210. In an exemplary embodiment, the common electrode 270 may include the transparent conductive material such as ITO, IZO, etc. A common voltage may be applied to the common electrode 270.

An alignment layer (not shown) may be disposed on an inner surface of the display panels 100 and 200, and may be a vertical alignment layer. Polarizers (not shown) are provided on the outer surfaces of the two display panels 100 and 200, transmissive axes of two polarizers are crossed, and it is preferable that one transmissive axis is parallel to the gate line 121. However, the polarizer may only be disposed at one outer surface of the two display panels 100 and 200.

The LC layer 3 has negative dielectric anisotropy, and LC molecules 310 of the LC layer 3 may be aligned so that long axes thereof are vertical with respect to the surface of the two display panels 100 and 200 in a state in which there is no electric field. Therefore, the incident light does not pass through the crossed polarizers but is blocked in a state in which there is no electric field.

At least one of the LC layer 3 and the alignment layer may include a photoreactive material, in detail, a reactive mesogen.

Next, the display device according to an exemplary embodiment will be described with reference to FIG. 5.

Figure 5:
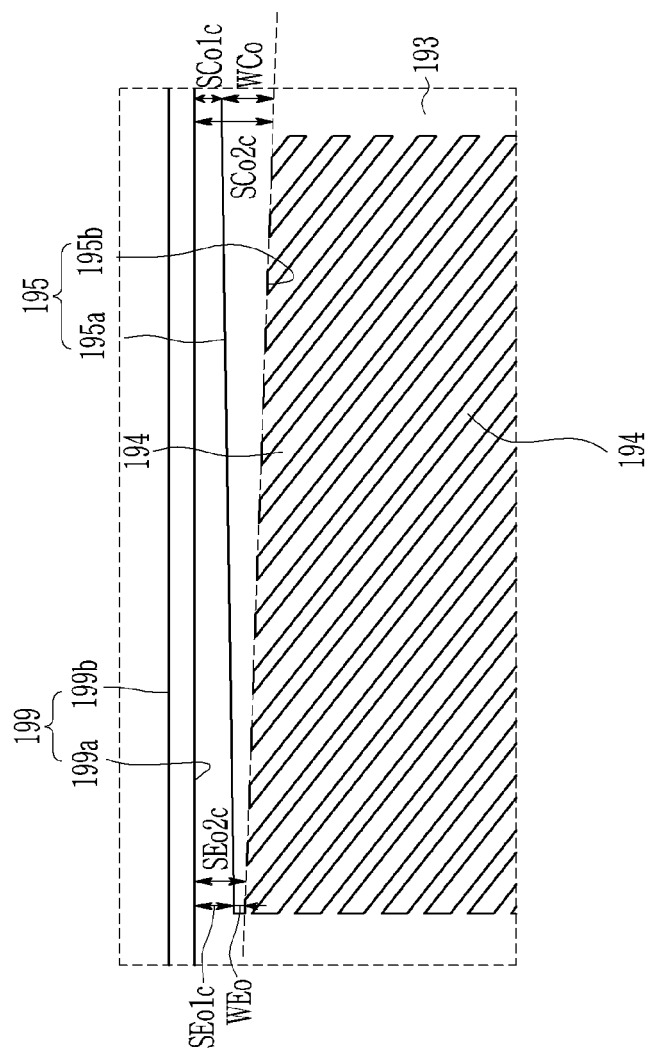
FIG. 5 is a plan view showing an exemplary embodiment of a partial region of a partial layer of a display device.

The display device according to an exemplary embodiment shown in FIG. 5 is substantially the same as the display device according to an exemplary embodiment shown in FIGS. 1 to 4 such that the repeated description thereof is omitted. In the illustrated exemplary embodiment, the plane shape of the outer branch part is different from the previous exemplary embodiment, and this will be described in detail.

FIG. 5 is a plan view showing a partial region of a partial layer of a display device according to an exemplary embodiment. FIG. 5 shows the sub-region positioned at the left-upper side and the storage electrode line adjacent thereto among four sub-regions of the pixel electrode of the display device according to an exemplary embodiment.

Like the foregoing exemplary embodiment, includes the pixel electrode 191 (refer to FIG. 3) includes the transverse branch part 192 (refer to FIG. 3), the longitudinal branch part 193, the minute branch part 194, and the outer branch part 195. The storage electrode line 199 is positioned to be separated from the pixel electrode 191.

The distance from the center part of at least one side of the outer branch part 195 to at least one side of the storage electrode line 199 is different the distance from the edge part of at least one side of the outer branch part 195 to the storage electrode line 199. Also, the width of the outer branch part 195 is not uniform and the width of the storage electrode line 199 is uniform along the transverse direction.

The distance SCo1c from the center part of the first side 195a of the outer branch part 195 to the storage electrode line 199 is different from the distance SEo1c from the edge part of the first side 195a of the outer branch part 195 to the storage electrode line 199. The distance SCo1c from the center part of the first side 195a of the outer branch part 195 to the storage electrode line 199 is shorter than the distance SEo1c from the edge part of the first side 195a of the outer branch part 195 to the storage electrode line 199. The distance between the first side 195a of the outer branch part 195 and the storage electrode line 199 gradually increases from the center part of the outer branch part 195 toward the edge part of the outer branch part 195. The distance SCo2c from the center part of the second side 195b of the outer branch part 195 to the storage electrode line 199 is different from the distance SEo2c from the edge part of the second side 195b of the outer branch part 195 to the storage electrode line 199. The distance SCo2c from the center part of the second side 195b of the outer branch part 195 to the storage electrode line 199 is longer than the distance SEo2c from the edge part of the second side 195b of the outer branch part 195 to the storage electrode line 199. The distance between the second side 195b of the outer branch part 195 and the storage electrode line 199 gradually decreases from the center part of the outer branch part 195 toward the edge part of the outer branch part 195. The first side 195a and the second side 195b of the outer branch part 195 are provided with the shape that is inclined with respect to the storage electrode line 199.

The width WCo of the center part of the outer branch part 195 is different from the width WEo of the edge part of the outer branch part 195. The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

In the illustrated exemplary embodiment, as the width of the outer branch part 195 is differentiated depending on the position along the transverse direction and both sides of the outer branch part 195 have the shape that is inclined with respect to the storage electrode line 199, the lateral field may be generated between the outer branch part 195 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with the shape that is approximately similar to that of the gate line 121. Accordingly, the shortest distance from the center part of at least one side of the outer branch part 195 to at least one side of the gate line 121 may be different from the shortest distance from the edge part of at least one side of the outer branch part 195 to at least one side of the gate line 121. In an exemplary embodiment, the distance from the center part of the first side 195a of the outer branch part 195 to the gate line 121 may be shorter than the distance from the edge part of the first side 195a of the outer branch part 195 to the gate line 121, for example. The distance between the first side 195a of the outer branch part 195 and the gate line 121 may gradually increase from the center part of the outer branch part 195 toward the edge part of the outer branch part 195. The distance from the center part of the second side 195b of the outer branch part 195 to the gate line 121 may be longer than the distance from the edge part of the second side 195b of the outer branch part 195 to the gate line 121. The distance between the second side 195b of the outer branch part 195 and the gate line 121 may gradually decrease from the center part of the outer branch part 195 toward the edge part of the outer branch part 195.

Figure 6:
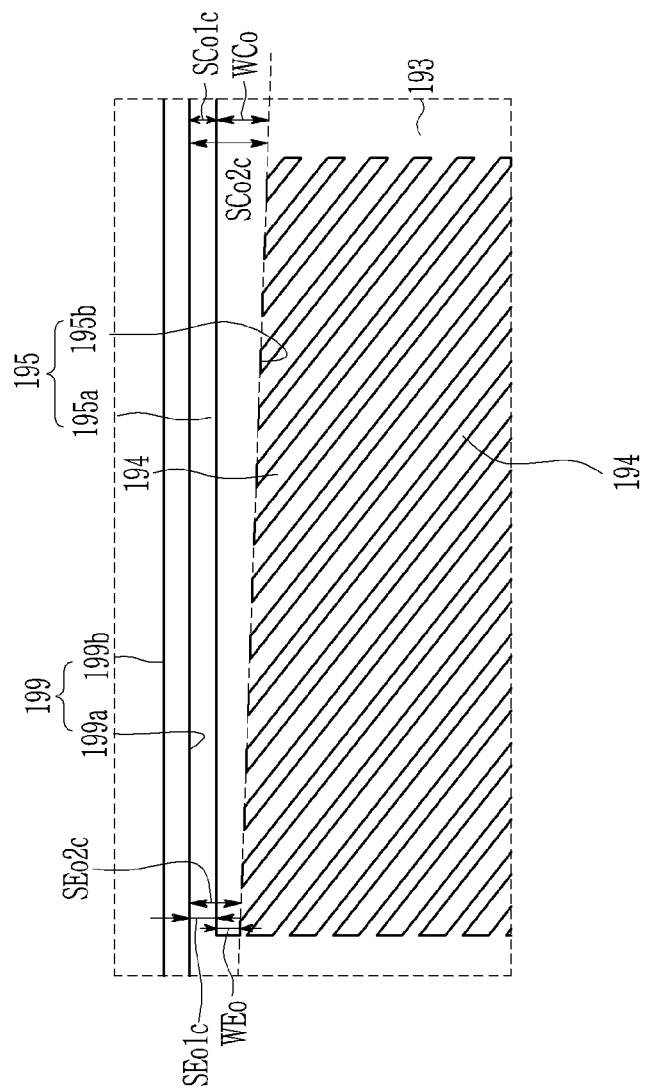
FIG. 6 is a plan view of a partial region of an exemplary embodiment of a partial layer of a display device.

Next, the display device according to an exemplary embodiment will be described with reference to FIG. 6. The display device according to an exemplary embodiment shown in FIG. 6 is substantially the same as the display device according to an exemplary embodiment shown in FIGS. 1 to 4 such that the repeated description thereof is omitted. In the illustrated exemplary embodiment, the plane shape of the outer branch part is different from the foregoing exemplary embodiment, and this will be described in detail.

FIG. 6 is a plan view showing a partial region of a partial layer of a display device according to an exemplary embodiment. FIG. 6 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 3) includes the transverse branch part 192 (refer to FIG. 3), the longitudinal branch part 193, the minute branch part 194, and the outer branch part 195. The storage electrode line 199 is positioned to be separated from the pixel electrode 191.

The distance from the center part of at least one side of the outer branch part 195 to at least one side of the storage electrode line 199 is different the distance from the edge part of at least one side of the outer branch part 195 to the storage electrode line 199. Also, the width of the outer branch part 195 is not uniform and the width of the storage electrode line 199 is uniform along the transverse direction.

The distance SCo1c from the center part of the first side 195a of the outer branch part 195 to the storage electrode line 199 is substantially the same as the distance SEo1c from the edge part of the first side 195a of the outer branch part 195 to the storage electrode line 199. The distance between the first side 195a of the outer branch part 195 and the storage electrode line 199 is uniform along the transverse direction the transverse direction. The distance SCo2c from the center part of the second side 195b of the outer branch part 195 to the storage electrode line 199 is different from the distance SEo2c from the edge part of the second side 195b of the outer branch part 195 to the storage electrode line 199. The distance SCo2c from the center part of the second side 195b of the outer branch part 195 to the storage electrode line 199 is longer than the distance SEo2c from the edge part of the second side 195b of the outer branch part 195 to the storage electrode line 199. The distance between the second side 195b of the outer branch part 195 and the storage electrode line 199 gradually decreases from the center part of the outer branch part 195 toward the edge part of the outer branch part 195. The second side 195b of the outer branch part 195 is provided with the shape that is inclined with respect to the storage electrode line 199.

The width WCo of the center part of the outer branch part 195 is different from the width WEo of the edge part of the outer branch part 195. The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

In the illustrated exemplary embodiment, as the width of the outer branch part 195 is different depending on the position and one side of the outer branch part 195 is provided with the shape that is inclined with respect to the storage electrode line 199, the lateral field may be generated between the outer branch part 195 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with the shape that is approximately similar to that of the gate line 121. Accordingly, the shortest distance from the center part of at least one side of the outer branch part 195 to at least one side of the gate line 121 may be different from the shortest distance from the edge part of at least one side of the outer branch part 195 to at least one side of the gate line 121. The distance from the center part of the second side 195b of the outer branch part 195 to the gate line 121 may be longer than the distance from the edge part of the second side 195b of the outer branch part 195 to the gate line 121. The distance between the second side 195b of the outer branch part 195 and the gate line 121 may gradually decrease from the center part of the outer branch part 195 toward the edge part of the outer branch part 195.

Next, the display device according to an exemplary embodiment will be described with reference to FIGS. 7 and 8.

Figure 7:
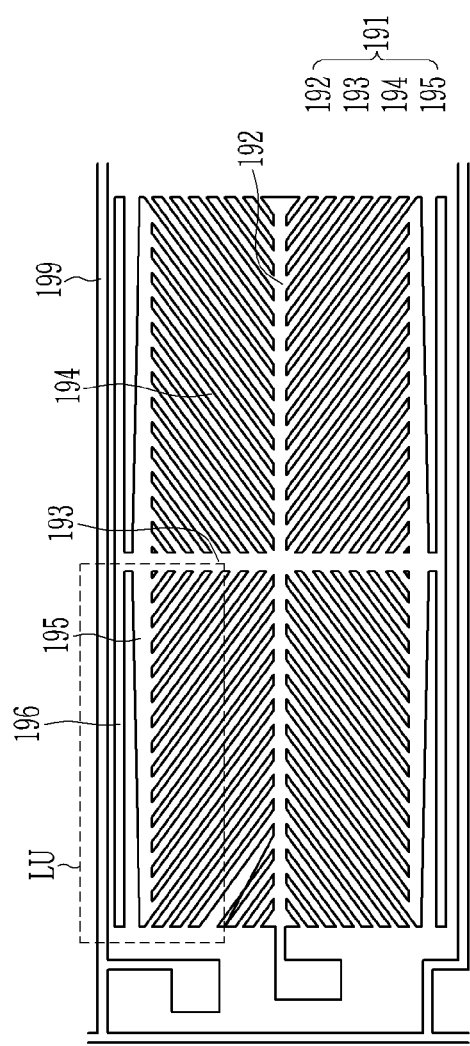
FIG. 7 is a plan view showing an exemplary embodiment of one layer of a display device.
Figure 8:
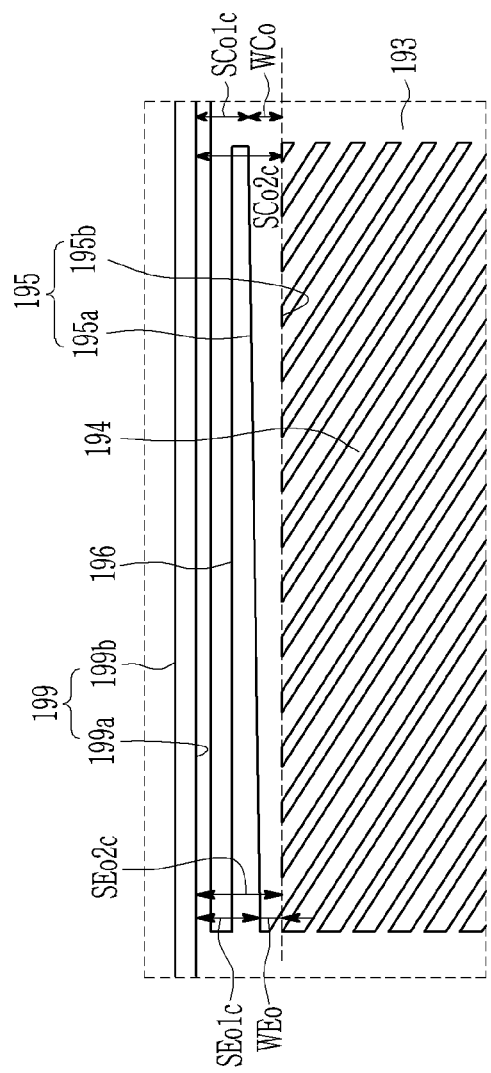
FIG. 8 is a plan view of an exemplary embodiment of a partial region of FIG. 7.

The display device according to an exemplary embodiment shown in FIGS. 7 and 8 is substantially the same as the display device according to an exemplary embodiment shown in FIGS. 1 to 4 such that the repeated description thereof is omitted. In the illustrated exemplary embodiment, the pixel electrode further including a dummy branch part is different from the foregoing exemplary embodiment, and this will be described in detail.

FIG. 7 is a plan view showing one layer of a display device according to an exemplary embodiment, and FIG. 8 is a plan view of a partial region of FIG. 7. FIG. 7 shows the pixel electrode and the storage electrode line of the display device according to an exemplary embodiment. FIG. 8 shows the part LU including the sub-region positioned at the left-upper side and the storage electrode line adjacent thereto among four sub-regions of the pixel electrode of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191.

The pixel electrode 191 further includes a dummy branch part 196. The dummy branch part 196 is positioned between the outer branch part 195 and the storage electrode line 199. The dummy branch part 196 may mainly extend in the transverse direction. Accordingly, the dummy branch part 196 may be positioned on an upper edge and a lower edge of the pixel electrode 191. However, the invention is not limited thereto, the dummy branch part 196 may be further positioned on a left edge and a right edge of the pixel electrode 191, and the dummy branch part 196 positioned on the left edge and the right edge of the pixel electrode 191 may extend in the longitudinal direction.

The width of the dummy branch part 196 may be uniform. The distance between the dummy branch part 196 and the storage electrode line 199 may be uniform. The distance SCo1c from the center part of the first side 195a of the outer branch part 195 to the storage electrode line 199 is shorter than the distance SEo1c from the edge part of the first side 195a of the outer branch part 195 to the storage electrode line 199. The distance between the first side 195a of the outer branch part 195 and the storage electrode line 199 gradually increases from the center part of the outer branch part 195 toward the edge part of the outer branch part 195. Accordingly, the distance between the first side 195a of the outer branch part 195 and the dummy branch part 196 gradually increases from the center part of the outer branch part 195 toward the edge part of the outer branch part 195. The distance SCo2c from the center part of the second side 195b of the outer branch part 195 to the storage electrode line 199 is substantially the same as the distance SEo2c from the edge part of the second side 195b of the outer branch part 195 to the storage electrode line 199. The distance between the second side 195b of the outer branch part 195 and the storage electrode line 199 is uniform along the transverse direction. Accordingly, the distance between the second side 195b of the outer branch part 195 and the dummy branch part 196 is uniform along the transverse direction.

The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

Next, the display device according to an exemplary embodiment will be described with reference to FIG. 9.

Figure 9:
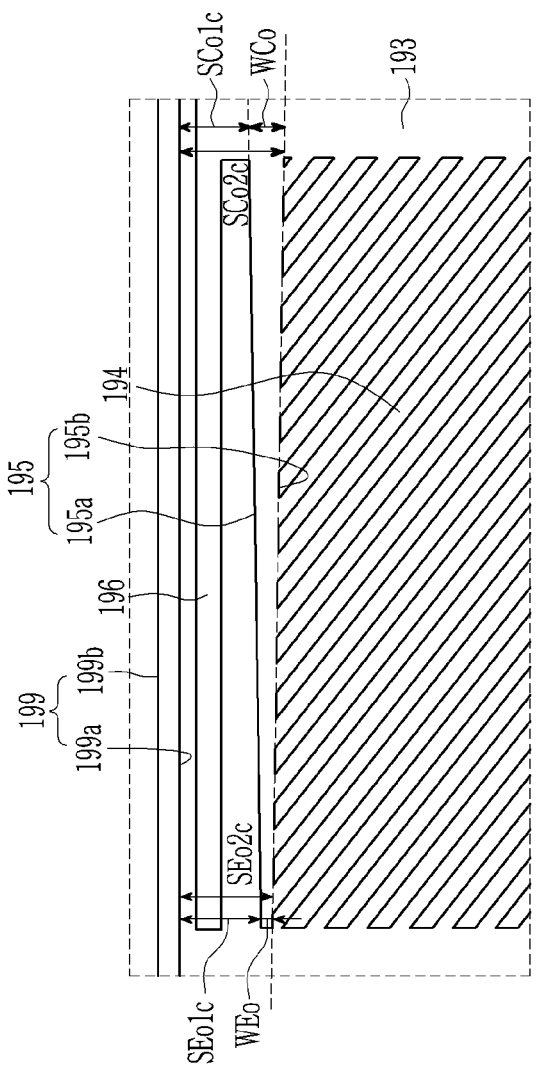
FIG. 9 is a plan view of an exemplary embodiment of a partial region of a partial layer of a display device.

The display device according to an exemplary embodiment shown in FIG. 9 is substantially the same as the display device according to an exemplary embodiment shown in FIG. 5 such that the repeated description thereof is omitted. In the illustrated exemplary embodiment, the pixel electrode further including the dummy branch part is different from the foregoing exemplary embodiment, and this will be described in detail.

FIG. 9 is a plan view of a partial region of a partial layer of a display device according to an exemplary embodiment. FIG. 9 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The pixel electrode 191 further includes a dummy branch part 196. The dummy branch part 196 is positioned between the outer branch part 195 and the storage electrode line 199. The dummy branch part 196 may mainly extend in the transverse direction.

The width of the dummy branch part 196 may be uniform. The distance between the dummy branch part 196 and the storage electrode line 199 may be uniform.

The distance SCo1c from the center part of the first side 195a of the outer branch part 195 to the storage electrode line 199 is shorter than the distance SEo1c from the edge part of the first side 195a of the outer branch part 195 to the storage electrode line 199. The distance between the first side 195a of the outer branch part 195 and the storage electrode line 199 gradually increases from the center part of the outer branch part 195 toward the edge part of the outer branch part 195. Accordingly, the distance between the first side 195a of the outer branch part 195 and the dummy branch part 196 gradually increases from the center part of the outer branch part 195 toward the edge part of the outer branch part 195. The distance SCo2c from the center part of the second side 195b of the outer branch part 195 to the storage electrode line 199 is longer than the distance SEo2c from the edge part of the second side 195b of the outer branch part 195 to the storage electrode line 199. The distance between the second side 195b of the outer branch part 195 and the storage electrode line 199 gradually decreases from the center part of the outer branch part 195 toward the edge part of the outer branch part 195. Accordingly, the distance between the second side 195b of the outer branch part 195 and the dummy branch part 196 gradually decreases from the center part of the outer branch part 195 toward the edge part of the outer branch part 195.

The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

Next, the display device according to an exemplary embodiment will be described with reference to FIG. 10.

Figure 10:
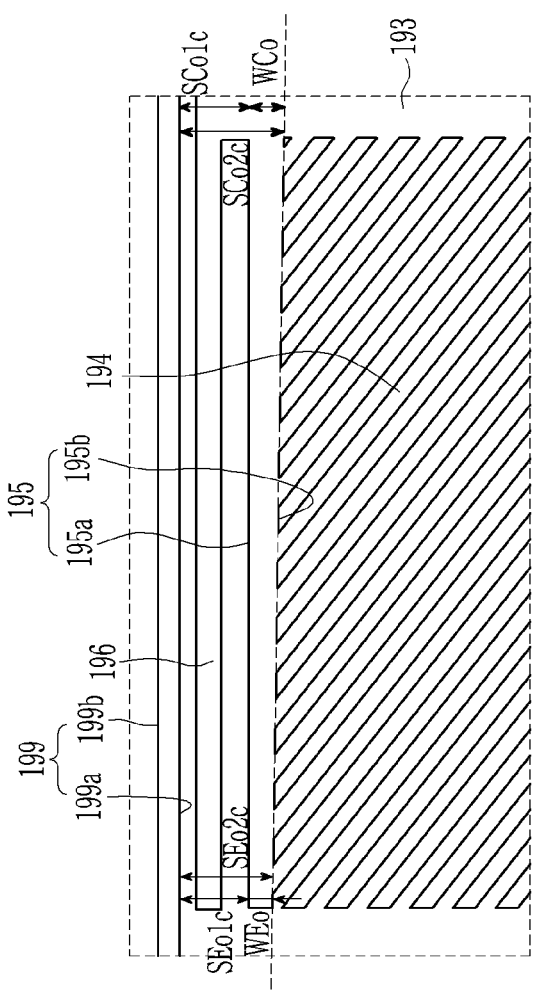
FIG. 10 is a plan view of an exemplary embodiment of a partial region of a partial layer of a display device.

The display device according to an exemplary embodiment shown in FIG. 10 is substantially the same as the display device according to an exemplary embodiment shown in FIG. 6 such that the repeated description thereof is omitted. In the illustrated exemplary embodiment, the pixel electrode further including the dummy branch part is different from the foregoing exemplary embodiment, and this will be described in detail.

FIG. 10 is a plan view of a partial region of a partial layer of a display device according to an exemplary embodiment. FIG. 10 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The pixel electrode 191 further includes a dummy branch part 196. The dummy branch part 196 is positioned between the outer branch part 195 and the storage electrode line 199. The dummy branch part 196 may mainly extend in the transverse direction.

The width of the dummy branch part 196 may be uniform. The distance between the dummy branch part 196 and the storage electrode line 199 may be uniform.

The distance SCo1c from the center part of the first side 195a of the outer branch part 195 to the storage electrode line 199 is substantially the same as the distance SEo1c from the edge part of the first side 195a of the outer branch part 195 to the storage electrode line 199. The distance between the first side 195a of the outer branch part 195 and the storage electrode line 199 is uniform along the transverse direction. Accordingly, the distance between the first side 195a of the outer branch part 195 and the dummy branch part 196 is uniform along the transverse direction. The distance SCo2c from the center part of the second side 195b of the outer branch part 195 to the storage electrode line 199 is longer than the distance SEo2c from the edge part of the second side 195b of the outer branch part 195 to the storage electrode line 199. The distance between the second side 195b of the outer branch part 195 and the storage electrode line 199 gradually decreases from the center part of the outer branch part 195 toward the edge part of the outer branch part 195. Accordingly, the distance between the second side 195b of the outer branch part 195 and the dummy branch part 196 gradually decreases from the center part of the outer branch part 195 toward the edge part of the outer branch part 195.

The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

Next, the display device according to an exemplary embodiment will be described with reference to FIG. 11.

Figure 11:
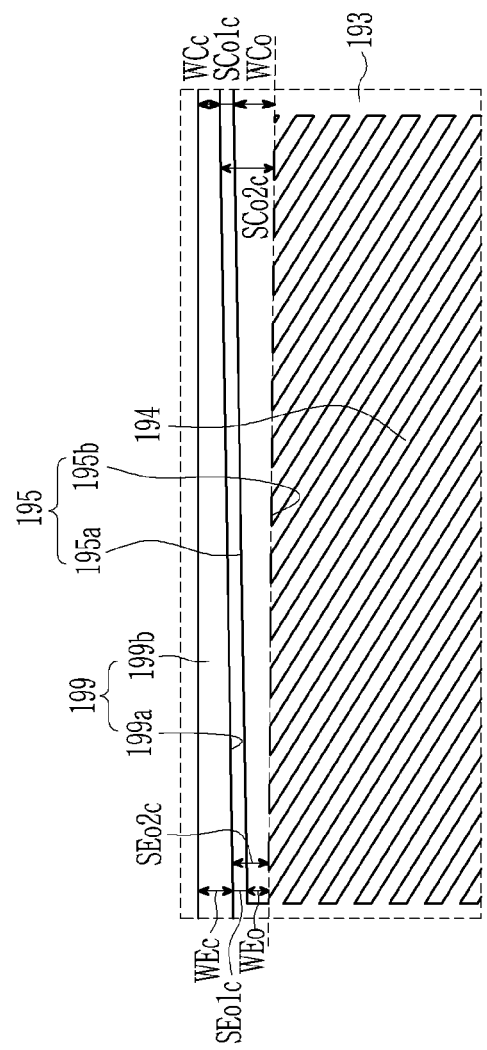
FIG. 11 is a plan view of an exemplary embodiment of a partial region of a partial layer of a display device.

The display device according to an exemplary embodiment shown in FIG. 11 is substantially the same as the display device according to an exemplary embodiment shown in FIGS. 1 to 4 such that the repeated description thereof is omitted. In the illustrated exemplary embodiment, the plane shape of the storage electrode line is different from the foregoing exemplary embodiment, and this will be described in detail.

FIG. 11 is a plan view of a partial region of a partial layer of a display device according to an exemplary embodiment. FIG. 11 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The distance from a center part of at least one side of the outer branch part 195 to at least one side of the storage electrode line 199 is different from the distance from an edge part of at least one side of the outer branch part 195 to at least one side of the storage electrode line 199. Also, the width of the outer branch part 195 is not uniform and the width of the storage electrode line 199 is not uniform.

The distance SCo1c from the center part of the first side 195a of the outer branch part 195 to the storage electrode line 199 is substantially the same as the distance SEo1c from the edge part of the first side 195a of the outer branch part 195 to the storage electrode line 199. The distance SCo2c from the center part of the second side 195b of the outer branch part 195 to the storage electrode line 199 is different from the distance SEo2c from the edge part of the second side 195b of the outer branch part 195 to the storage electrode line 199. The distance SCo2c from the center part of the second side 195b of the outer branch part 195 to the storage electrode line 199 is longer than the distance SEo2c from the edge part of the second side 195b of the outer branch part 195 to the storage electrode line 199. The distance between the second side 195b of the outer branch part 195 and the storage electrode line 199 gradually decreases from the center part of the outer branch part 195 toward the edge part of the outer branch part 195.

The width WCo of the center part of the outer branch part 195 is different from the width WEo of the edge part of the outer branch part 195. The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195.

The width WCc of the center part of the storage electrode line 199 is different from the width WEc of the edge part of the storage electrode line 199. The center part of the storage electrode line 199 means the part adjacent to the center part of the outer branch part 195, and the edge part of the storage electrode line 199 means the part adjacent to the edge part of the outer branch part 195. The width WCc of the center part of the storage electrode line 199 is smaller than the width WEo of the edge part of the storage electrode line 199. The width of the storage electrode line 199 gradually increases from the center part of the storage electrode line 199 toward the edge part of the storage electrode line 199.

In the illustrated exemplary embodiment, as the width of the outer branch part 195 and the width of the storage electrode line 199 are differentiated depending on the position in the transverse direction and one side of the storage electrode line 199 and the outer branch part 195 have the shape that is inclined with respect to the other side of the storage electrode line 199, the lateral field may be generated between the outer branch part 195 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 12.

Figure 12:
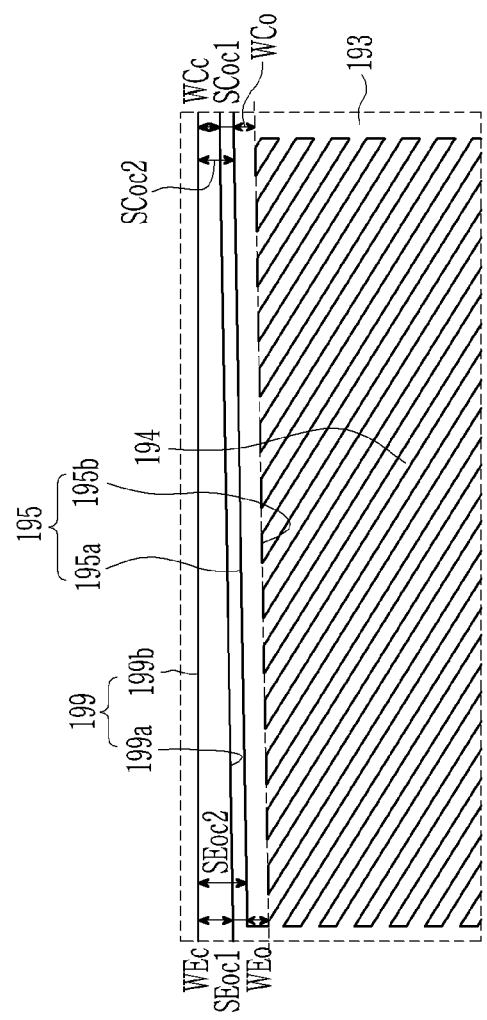
FIG. 12 is a plan view of an exemplary embodiment of a partial region of a partial layer of a display device.

The display device according to an exemplary embodiment shown in FIG. 12 is substantially the same as the display device according to an exemplary embodiment shown in FIG. 11 such that the repeated description thereof is omitted. In the illustrated exemplary embodiment, the outer branch part having the uniform width in the transverse direction is different from the foregoing exemplary embodiment, and this will be described in detail.

FIG. 12 is a plan view of a partial region of a partial layer of a display device according to an exemplary embodiment. FIG. 12 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The distance from the center part of at least one side of the outer branch part 195 to at least one side of the storage electrode line 199 is different from the distance from the edge part of at least one side of the outer branch part 195 to at least one side of the storage electrode line 199. Also, the width of the outer branch part 195 is uniform and the width of the storage electrode line 199 is not uniform along the transverse direction.

The distance SCoc1 from the center part of the outer branch part 195 to the first side 199a of the storage electrode line 199 is substantially the same as the distance SEoc1 from the edge part of the outer branch part 195 to the first side 199a of the storage electrode line 199. The distance SCoc1 from the center part of the outer branch part 195 to the first side 199a of the storage electrode line 199 means the shortest distance from the center part of the first side 195a of the outer branch part 195 to the first side 199a of the storage electrode line 199. The distance SEoc1 from the edge part of the outer branch part 195 to the first side 199a of the storage electrode line 199 means the shortest distance from the edge part of the first side 195a of the outer branch part 195 to the first side 199a of the storage electrode line 199. The distance between the outer branch part 195 and the first side 199a of the storage electrode line 199 is uniform along the transverse direction.

The distance SCoc2 from the center part of the outer branch part 195 to the second side 199b of the storage electrode line 199 is different from the distance SEoc2 from the edge part of the outer branch part 195 to the second side 199b of the storage electrode line 199. The distance SCoc2 from the center part of the outer branch part 195 to the second side 199b of the storage electrode line 199 means the shortest distance from the center part of the first side 195a of the outer branch part 195 to the second side 199b of the storage electrode line 199. The distance SEoc2 from the edge part of the outer branch part 195 to the second side 199b of the storage electrode line 199 means the shortest distance from the edge part of the first side 195a of the outer branch part 195 to the second side 199b of the storage electrode line 199. The distance SCoc2 from the center part of the outer branch part 195 to the second side 199b of the storage electrode line 199 is shorter than the distance SEoc2 from the edge part of the outer branch part 195 to the second side 199b of the storage electrode line 199. The distance between the outer branch part 195 and the second side 199b of the storage electrode line 199 gradually increases from the center part of the outer branch part 195 toward the edge part of the outer branch part 195. The outer branch part 195 is provided with the shape that is inclined with respect to the second side 199b of the storage electrode line 199.

The width WCo of the center part of the outer branch part 195 is substantially the same as the width WEo of the edge part of the outer branch part 195. The width of the outer branch part 195 is uniform along the transverse direction.

The width WCc of the center part of the storage electrode line 199 is different from the width WEc of the edge part of the storage electrode line 199. The width WCc of the center part of the storage electrode line 199 is smaller than the width WEc of the edge part of the storage electrode line 199. The width of the storage electrode line 199 gradually increases from the center part of the storage electrode line 199 toward the edge part of the storage electrode line 199.

In the illustrated exemplary embodiment, as the width of the storage electrode line 199 is differentiated depending on the position along the transverse direction and the outer branch part 195 has the shape that is inclined with respect to the one side of the storage electrode line 199, the lateral field may be generated between the outer branch part 195 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 13.

Figure 13:
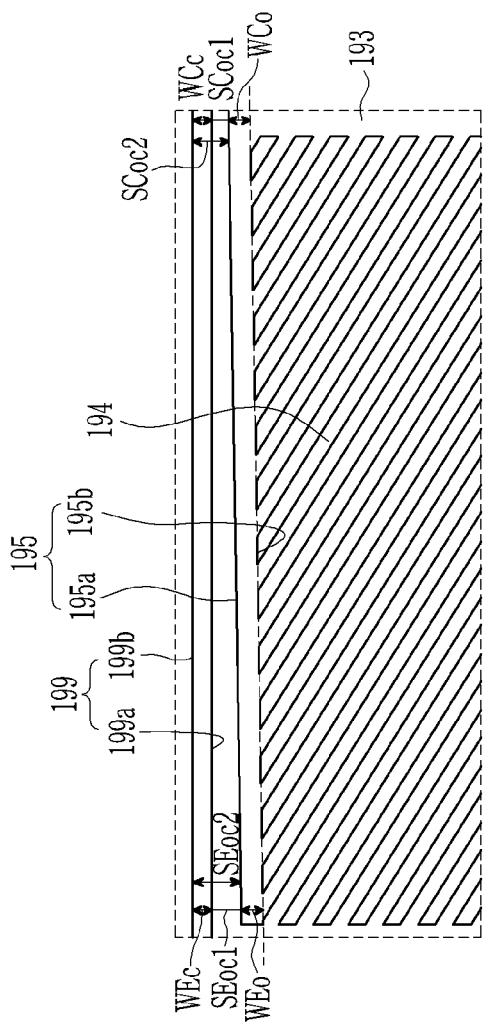
FIG. 13 is a plan view of an exemplary embodiment of a partial region of a partial layer of a display device.

The display device according to an exemplary embodiment shown in FIG. 13 is substantially the same as the display device according to an exemplary embodiment shown in FIG. 12 such that the repeated description thereof is omitted. In the illustrated exemplary embodiment, the plane shape of the storage electrode line is different from the foregoing exemplary embodiment, and this will be described in detail.

FIG. 13 is a plan view of a partial region of a partial layer of a display device according to an exemplary embodiment. FIG. 13 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The distance from the center part of at least one side of the outer branch part 195 to at least one side of the storage electrode line 199 is different from the distance from the edge part of at least one side of the outer branch part 195 to at least one side of the storage electrode line 199. Also, the width of the outer branch part 195 is uniform and the width of the storage electrode line 199 is uniform along the transverse direction.

The distance SCoc1 from the center part of the outer branch part 195 to the first side 199a of the storage electrode line 199 is different from the distance SEoc1 from the edge part of the outer branch part 195 to the first side 199a of the storage electrode line 199. The distance SCoc1 from the center part of the outer branch part 195 to the first side 199a of the storage electrode line 199 is shorter than the distance SEoc1 from the edge part of the outer branch part 195 to the first side 199a of the storage electrode line 199. The distance between the outer branch part 195 and the first side 199a of the storage electrode line 199 gradually increases from the center part of the outer branch part 195 toward the edge part of the outer branch part 195. The outer branch part 195 is provided with the shape that is inclined with respect to the first side 199a of the storage electrode line 199.

The distance SCoc2 from the center part of the outer branch part 195 to the second side 199b of the storage electrode line 199 is different from the distance SEoc2 from the edge part of the outer branch part 195 to the second side 199b of the storage electrode line 199. The distance SCoc2 from the center part of the outer branch part 195 to the second side 199b of the storage electrode line 199 is shorter than the distance SEoc2 from the edge part of the outer branch part 195 to the second side 199b of the storage electrode line 199. The distance between the outer branch part 195 and the second side 199b of the storage electrode line 199 gradually increases from the center part of the outer branch part 195 toward the edge part of the outer branch part 195. The outer branch part 195 is provided with the shape that is inclined with respect to the second side 199b of the storage electrode line 199.

The width WCo of the center part of the outer branch part 195 is substantially the same as the width WEo of the edge part of the outer branch part 195. The width of the outer branch part 195 is uniform along the transverse direction.

The width WCc of the center part of the storage electrode line 199 is substantially the same as the width WEc of the edge part of the storage electrode line 199. The width of the storage electrode line 199 is uniform along the transverse direction.

In the illustrated exemplary embodiment, as the outer branch part 195 has the shape that is inclined with respect to the storage electrode line 199, the lateral field may be generated between the outer branch part 195 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 14.

Figure 14:
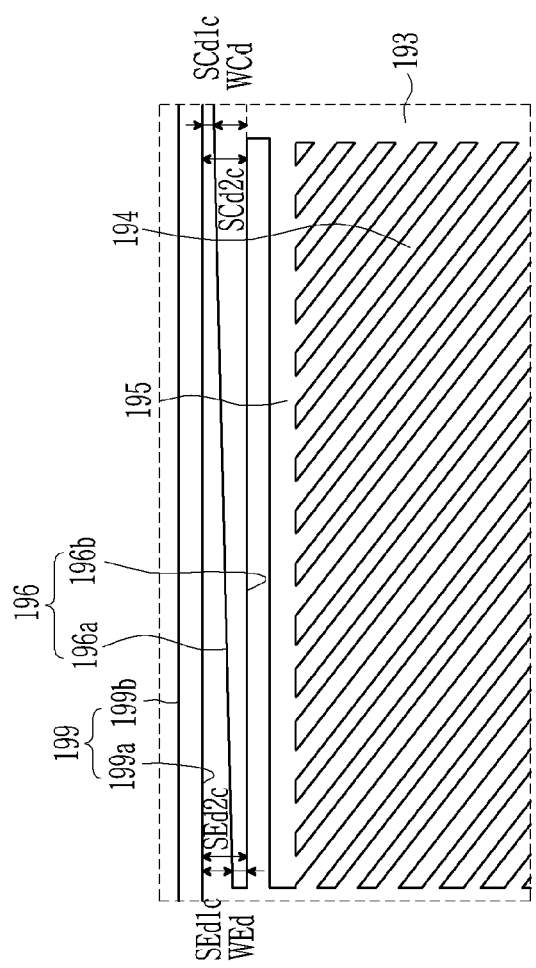
FIG. 14 is a plan view of one layer of a display device.

The display device according to an exemplary embodiment shown in FIG. 14 is substantially the same as the display device according to an exemplary embodiment shown in FIGS. 7 and 8 such that the repeated description thereof is omitted. In the illustrated exemplary embodiment, the plane shape of the outer branch part and the dummy branch part is different from the foregoing exemplary embodiment, and this will be described in detail.

FIG. 14 is a plan view of one layer of a display device according to an exemplary embodiment. FIG. 14 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is uniform, the width of the dummy branch part 196 is not uniform, and the width of the storage electrode line 199 is uniform along the transverse direction.

The dummy branch part 196 includes a first side 196a adjacent to the storage electrode line 199 and a second side 196b facing the first side 196a. The second side 196b of the dummy branch part 196 is adjacent to the outer branch part 195. The position where the dummy branch part 196 and the longitudinal branch part 193 meet may be the center part of the dummy branch part 196. Also, the position farthest from the longitudinal branch part 193 along a transverse direction may be the edge part of the dummy branch part 196. The width of the dummy branch part 196 means the distance between the first side 196a and the second side 196b.

The distance SCd1c from the center part of the first side 196a of the dummy branch part 196 to the storage electrode line 199 is different from the distance SEd1c from the edge part of the first side 196a of the dummy branch part 196 to the storage electrode line 199. The distance SCd1c from the center part of the first side 196a of the dummy branch part 196 to the storage electrode line 199 means the shortest distance from the center part of the first side 196a of the dummy branch part 196 to the first side 199a of the storage electrode line 199. The distance SEd1c from the edge part of the first side 196a of the dummy branch part 196 to the storage electrode line 199 means the shortest distance from the edge part of the first side 196a of the dummy branch part 196 to the first side 199a of the storage electrode line 199. The distance SCd1c from the center part of the first side 196a of the dummy branch part 196 to the storage electrode line 199 is shorter than the distance SEd1c from the edge part of the first side 196a of the dummy branch part 196 to the storage electrode line 199. The distance between the first side 196a of the dummy branch part 196 and the storage electrode line 199 gradually increases from the center part of the dummy branch part 196 to the edge part of the dummy branch part 196. The first side 196a of the dummy branch part 196 is provided with the shape that is inclined with respect to the storage electrode line 199.

The distance SCd2c from the center part of the second side 196b of the dummy branch part 196 to the storage electrode line 199 is substantially the same as the distance SEd2c from the edge part of the second side 196b of the dummy branch part 196 to the storage electrode line 199. The distance SCd2c from the center part of the second side 196b of the dummy branch part 196 to the storage electrode line 199 means the shortest distance from the center part of the second side 196b of the dummy branch part 196 to the first side 199a of the storage electrode line 199. The distance SEd2c from the edge part of the second side 196b of the dummy branch part 196 to the storage electrode line 199 means the shortest distance from the edge part of the second side 196b of the dummy branch part 196 to the first side 199a of the storage electrode line 199. The distance between the second side 196b of the dummy branch part 196 and the storage electrode line 199 is uniform along the transverse direction.

The width WCd of the center part of the dummy branch part 196 is different from the width WEd of the edge part of the dummy branch part 196. The width WCd of the center part of the dummy branch part 196 is larger than the width WEd of the edge part of the dummy branch part 196. The width of the dummy branch part 196 gradually decreases from the center part of the dummy branch part 196 toward the edge part of the dummy branch part 196.

In the illustrated exemplary embodiment, as the width of the dummy branch part 196 is differentiated depending on the position along the transverse direction and one side of the dummy branch part 196 has the shape that is inclined with respect to the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with the shape that is substantially similar to that of the gate line 121. Accordingly, the shortest distance from the center part of at least one side of the dummy branch part 196 to at least one side of the gate line 121 may be different from the shortest distance from the edge part of at least one side of the dummy branch part 196 to at least one side of the gate line 121. In an exemplary embodiment, the distance from the center part of the first side 196a of the dummy branch part 196 to the gate line 121 may be shorter than the distance from the edge part of the first side 196a of the dummy branch part 196 to the gate line 121, for example. The distance between the first side 196a of the dummy branch part 196 and the gate line 121 may gradually increase from the center part of the dummy branch part 196 toward the edge part of the dummy branch part 196.

Next, the display device according to an exemplary embodiment will be described with reference to FIG. 15.

Figure 15:
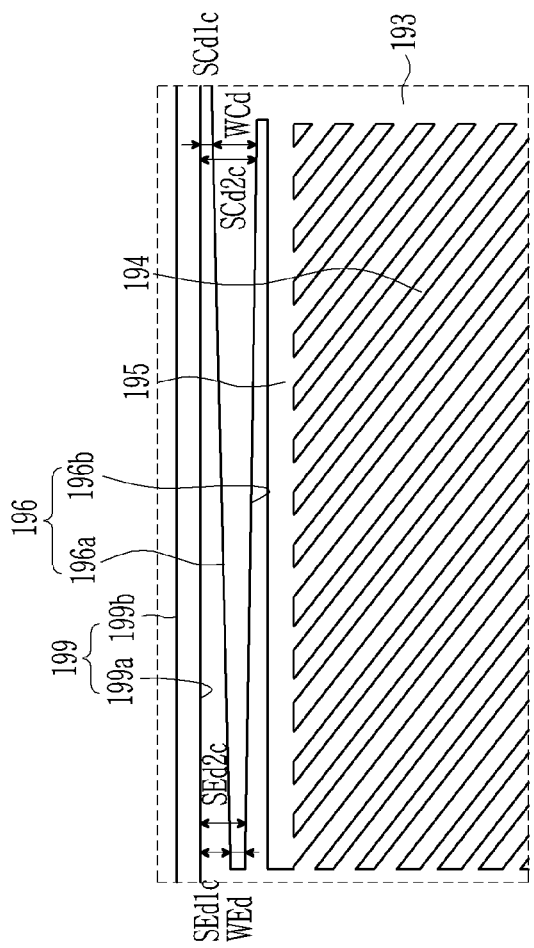
FIG. 15 is a plan view of an exemplary embodiment of a partial region of a partial layer of a display device.

The display device according to an exemplary embodiment shown in FIG. 15 is substantially the same as the display device according to an exemplary embodiment shown in FIG. 14 such that the repeated description thereof is omitted. In the illustrated exemplary embodiment, the plane shape of the dummy branch part is different from the foregoing exemplary embodiment, and this will be described in detail.

FIG. 15 is a plan view of a partial region of a partial layer of a display device according to an exemplary embodiment. FIG. 15 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is uniform, the width of the dummy branch part 196 is not uniform, and the width of the storage electrode line 199 is uniform along the transverse direction.

The distance SCd1c from the center part of the first side 196a of the dummy branch part 196 to the storage electrode line 199 is different from the distance SEd1c from the edge part of the first side 196a of the dummy branch part 196 to the storage electrode line 199. The distance SCd1c from the center part of the first side 196a of the dummy branch part 196 to the storage electrode line 199 is shorter than the distance SEd1c from the edge part of the first side 196a of the dummy branch part 196 to the storage electrode line 199. The distance between the first side 196a of the dummy branch part 196 and the storage electrode line 199 gradually increases from the center part of the dummy branch part 196 to the edge part of the dummy branch part 196. The first side 196a of the dummy branch part 196 is provided with the shape that is inclined with respect to the storage electrode line 199.

The distance SCd2c from the center part of the second side 196b of the dummy branch part 196 to the storage electrode line 199 is different from the distance SEd2c from the edge part of the second side 196b of the dummy branch part 196 to the storage electrode line 199. The distance SCd2c from the center part of the second side 196b of the dummy branch part 196 to the storage electrode line 199 is longer than the distance SEd2c from the edge part of the second side 196b of the dummy branch part 196 to the storage electrode line 199. The distance between the second side 196b of the dummy branch part 196 and the storage electrode line 199 gradually decreases from the center part of the dummy branch part 196 toward the edge part of the dummy branch part 196. The second side 196b of the dummy branch part 196 is provided with the shape that is inclined with respect to the storage electrode line 199.

The width WCd of the center part of the dummy branch part 196 is different from the width WEd of the edge part of the dummy branch part 196. The width WCd of the center part of the dummy branch part 196 is larger than the width WEd of the edge part of the dummy branch part 196. The width of the dummy branch part 196 gradually decreased from the center part of the dummy branch part 196 toward the edge part of the dummy branch part 196.

In the illustrated exemplary embodiment, as the width of the dummy branch part 196 is differentiated depending on the position along the transverse direction and both sides of the dummy branch part 196 have the shape that is inclined with respect to the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with the shape that is substantially similar to that of the gate line 121. Accordingly, the shortest distance from the center part of at least one side of the dummy branch part 196 to at least one side of the gate line 121 may be different from the shortest distance from the edge part of at least one side of the dummy branch part 196 to at least one side of the gate line 121. In an exemplary embodiment, the distance from the center part of the first side 196a of the dummy branch part 196 to the gate line 121 may be shorter than the distance from the edge part of the first side 196a of the dummy branch part 196 to the gate line 121, for example. The distance between the first side 196a of the dummy branch part 196 and the gate line 121 may gradually increase from the center part of the dummy branch part 196 toward the edge part of the dummy branch part 196. The distance from the center part of the second side 196b of the dummy branch part 196 to the gate line 121 may be longer than the distance from the edge part of the second side 196b of the dummy branch part 196 to the gate line 121. The distance between the second side 196b of the dummy branch part 196 and the gate line 121 may gradually decrease from the center part of the dummy branch part 196 toward the edge part of the dummy branch part 196.

Next, the display device according to an exemplary embodiment will be described with reference to FIG. 16.

Figure 16:
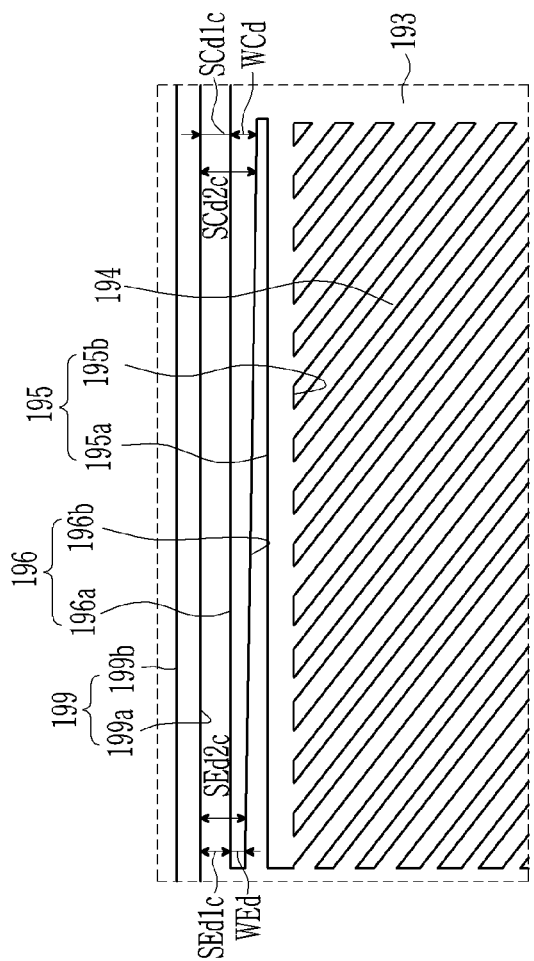
FIG. 16 is a plan view of an exemplary embodiment of a partial region of a partial layer of a display device.

The display device according to an exemplary embodiment shown in FIG. 16 is substantially the same as the display device according to an exemplary embodiment shown in FIG. 14 such that the repeated description thereof is omitted. In the illustrated exemplary embodiment, the plane shape of the dummy branch part is different from the foregoing exemplary embodiment, and this will be described in detail.

FIG. 16 is a plan view of a partial region of a partial layer of a display device according to an exemplary embodiment. FIG. 16 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is uniform, the width of the dummy branch part 196 is not uniform, and the width of the storage electrode line 199 is uniform along the transverse direction.

The distance $SCd1c$ from the center part of the first side 196a of the dummy branch part 196 to the storage electrode line 199 is substantially the same as the distance $SEd1c$ from the edge part of the first side 196a of the dummy branch part 196 to the storage electrode line 199. The distance between the first side 196a of the dummy branch part 196 and the storage electrode line 199 is uniform along the transverse direction.

The distance $SCd2c$ from the center part of the second side 196b of the dummy branch part 196 to the storage electrode line 199 is different from the distance $SEd2c$ from the edge part of the second side 196b of the dummy branch part 196 to the storage electrode line 199. The distance $SCd2c$ from the center part of the second side 196b of the dummy branch part 196 to the storage electrode line 199 is longer than the distance $SEd2c$ from the edge part of the second side 196b of the dummy branch part 196 to the storage electrode line 199. The distance between the second side 196b of the dummy branch part 196 and the storage electrode line 199 gradually decreases from the center part of the dummy branch part 196 toward the edge part of the dummy branch part 196. The second side 196b of the dummy branch part 196 is provided with the shape that is inclined with respect to the storage electrode line 199.

The width WCd of the center part of the dummy branch part 196 is different from the width WEd of the edge part of the dummy branch part 196. The width WCd of the center part of the dummy branch part 196 is larger than the width WEd of the edge part of the dummy branch part 196. The width of the dummy branch part 196 is gradually decreased from the center part of the dummy branch part 196 toward the edge part of the dummy branch part 196.

In the illustrated exemplary embodiment, as the width of the dummy branch part 196 is differentiated depending on the position along the transverse direction and one side of the dummy branch part 196 has the shape that is inclined with respect to the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

The storage electrode line 199 may overlap the gate line 121 and may extend to be elongated in the direction parallel to the gate line 121. The storage electrode line 199 may be provided with the shape that is substantially similar to that of the gate line 121. Accordingly, the shortest distance from the center part of at least one side of the dummy branch part 196 to at least one side of the gate line 121 may be different from the shortest distance from the edge part of at least one side of the dummy branch part 196 to at least one side of the gate line 121. In an exemplary embodiment, the distance from the center part of the second side 196b of the dummy branch part 196 to the gate line 121 may be longer than the distance from the edge part of the second side 196b of the dummy branch part 196 to the gate line 121, for example. The distance between the second side 196b of the dummy branch part 196 and the gate line 121 may gradually decrease from the center part of the dummy branch part 196 toward the edge part of the dummy branch part 196.

Next, the display device according to an exemplary embodiment will be described with reference to FIG. 17.

Figure 17:
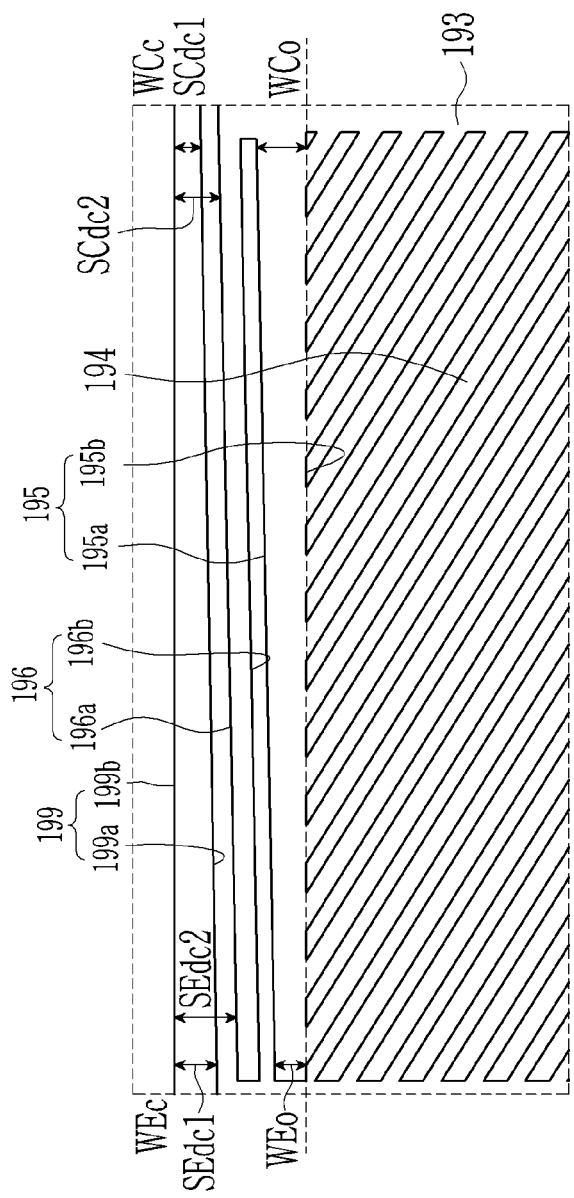
FIG. 17 is a plan view of an exemplary embodiment of a partial region of a partial layer of a display device.

The display device according to an exemplary embodiment shown in FIG. 17 is substantially the same as the display device according to an exemplary embodiment shown in FIG. 14 such that the repeated description thereof is omitted. In the illustrated exemplary embodiment, plane shapes of the storage electrode line, the dummy branch part, and the outer branch part are different from the foregoing exemplary embodiment, and this will be described in detail.

FIG. 17 is a plan view of a partial region of a partial layer of a display device according to an exemplary embodiment. FIG. 17 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is not uniform, the width of the dummy branch part 196 is uniform, and the width of the storage electrode line 199 is not uniform along the transverse direction.

The distance $SCdc1$ from the center part of the dummy branch part 196 to the first side 199a of the storage electrode line 199 is substantially the same as the distance $SEdc1$ from the edge part of the dummy branch part 196 to the first side 199a of the storage electrode line 199. The distance SCdc1 from the center part of the dummy branch part 196 to the first side 199a of the storage electrode line 199 means the shortest distance from the center part of the first side 196a of the dummy branch part 196 to the first side 199a of the storage electrode line 199. The distance SEdc1 from the edge part of the dummy branch part 196 to the first side 199a of the storage electrode line 199 means the shortest distance SEdc1 from the edge part of the first side 196a of the dummy branch part 196 to the first side 199a of the storage electrode line 199. The distance between the dummy branch part 196 and the storage electrode line 199 is uniform along the transverse direction.

The distance SCdc2 from the center part of the dummy branch part 196 to the second side 199b of the storage electrode line 199 is different from the distance SEdc2 from the edge part of the dummy branch part 196 to the second side 199b of the storage electrode line 199. The distance SCdc2 from the center part of the dummy branch part 196 to the second side 199b of the storage electrode line 199 means the shortest distance from the center part of the first side 196a of the dummy branch part 196 to the second side 199b of the storage electrode line 199. The distance SEdc2 from the edge part of the dummy branch part 196 to the second side 199b of the storage electrode line 199 means the distance from the edge part of the first side 196a of the dummy branch part 196 to the second side 199b of the storage electrode line 199. The distance SCdc2 from the center part of the dummy branch part 196 to the second side 199b of the storage electrode line 199 is shorter than the distance SEdc2 from the edge part of the dummy branch part 196 to the second side 199b of the storage electrode line 199. The distance between the dummy branch part 196 and the second side 199b of the storage electrode line 199 gradually increases from the center part of the dummy branch part 196 toward the edge part of the dummy branch part 196. The dummy branch part 196 is provided with the shape that is inclined with respect to the second side 199b of the storage electrode line 199.

The width WCo of the center part of the outer branch part 195 is different from the width WEo of the edge part of the outer branch part 195. The width WCo of the center part of the outer branch part 195 is larger than the width WEo of the edge part of the outer branch part 195. The width of the outer branch part 195 gradually decreases from the center part of the outer branch part 195 toward the edge part of the outer branch part 195. Also, the second side 195b of the outer branch part 195 is provided with the shape that is inclined with respect to the first side 199a of the storage electrode line 199.

The width of the dummy branch part 196 is uniform along the transverse direction. The distance between the outer branch part 195 and the dummy branch part 196 is uniform along the transverse direction.

The width WCc of the center part of the storage electrode line 199 is different from the width WEc of the edge part of the storage electrode line 199. The width WCc of the center part of the storage electrode line 199 is smaller than the width WEc of the edge part of the storage electrode line 199. The width of the storage electrode line 199 gradually increases from the center part of the storage electrode line 199 toward the edge part of the storage electrode line 199.

In the illustrated exemplary embodiment, as the width of the storage electrode line 199 and the width of the outer branch part 195 are differentiated depending on the position along the transverse direction, the dummy branch part 196 has the shape that is inclined with respect to one side of the storage electrode line 199, and one side of the outer branch part 195 has the shape that is inclined with respect to one side of the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 18.

Figure 18:
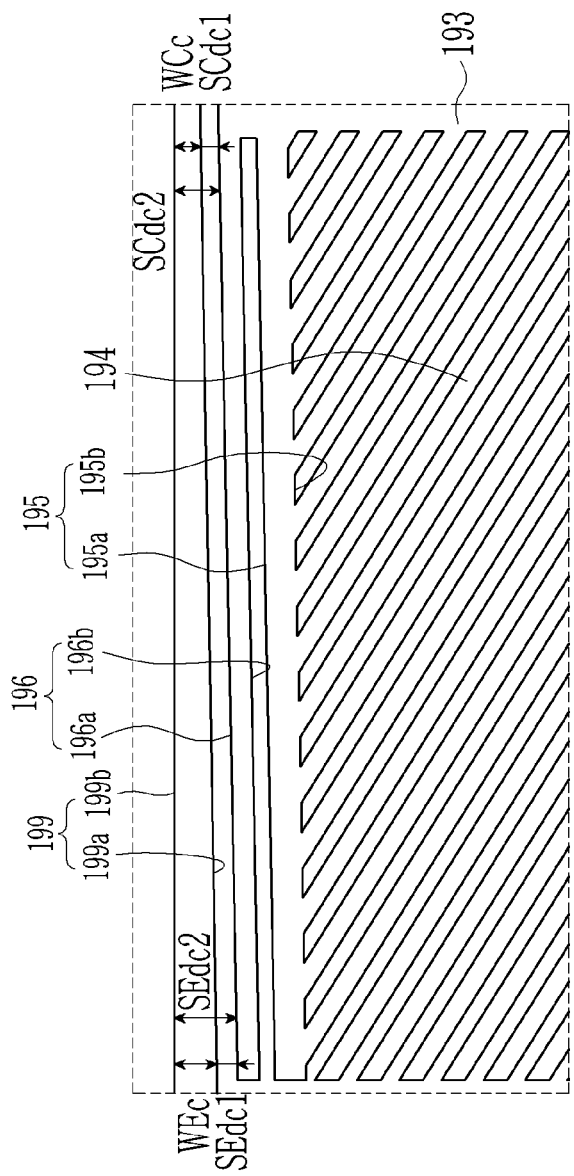
FIG. 18 is a plan view of an exemplary embodiment of a partial region of a partial layer of a display device.

The display device according to an exemplary embodiment shown in FIG. 18 is substantially the same as the display device according to an exemplary embodiment shown in FIG. 17 such that the repeated description thereof is omitted. In the illustrated exemplary embodiment, the plane shape of the outer branch part is different from the foregoing exemplary embodiment, and this will be described in detail.

FIG. 18 is a plan view of a partial region of a partial layer of a display device according to an exemplary embodiment. FIG. 18 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is uniform, the width of the dummy branch part 196 is uniform, and the width of the storage electrode line 199 is not uniform.

The distance SCdc1 from the center part of the dummy branch part 196 to the first side 199a of the storage electrode line 199 is substantially the same as the distance SEdc1 from the edge part of the dummy branch part 196 to the first side 199a of the storage electrode line 199. The distance between the dummy branch part 196 and the storage electrode line 199 is uniform along the transverse direction.

The distance SCdc2 from the center part of the dummy branch part 196 to the second side 199b of the storage electrode line 199 is different from the distance SEdc2 from the edge part of the dummy branch part 196 to the second side 199b of the storage electrode line 199. The distance SCdc2 from the center part of the dummy branch part 196 to the second side 199b of the storage electrode line 199 is shorter than the distance SEdc2 from the edge part of the dummy branch part 196 to the second side 199b of the storage electrode line 199. The distance between the dummy branch part 196 and the second side 199b of the storage electrode line 199 gradually increases from the center part of the dummy branch part 196 toward the edge part of the dummy branch part 196. The dummy branch part 196 is provided with the shape that is inclined with respect to the second side 199b of the storage electrode line 199.

The width of the outer branch part 195 is uniform along the transverse direction. The outer branch part 195 is provided with the shape that is inclined with respect to the second side 199b of the storage electrode line 199.

The width of the dummy branch part 196 is uniform along the transverse direction. The distance between the outer branch part 195 and the dummy branch part 196 is uniform along the transverse direction.

The width WCc of the center part of the storage electrode line 199 is different from the width WEc of the edge part of the storage electrode line 199. The width WCc of the center part of the storage electrode line 199 is smaller than the width WEc of the edge part of the storage electrode line 199. The width of the storage electrode line 199 gradually increases from the center part of the storage electrode line 199 toward the edge part of the storage electrode line 199.

In the illustrated exemplary embodiment, as the width of the storage electrode line 199 is differentiated depending on the position in the transverse direction and the outer branch part 195 and the dummy branch part 196 have the shape that is inclined with respect to one side of the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 19.

Figure 19:
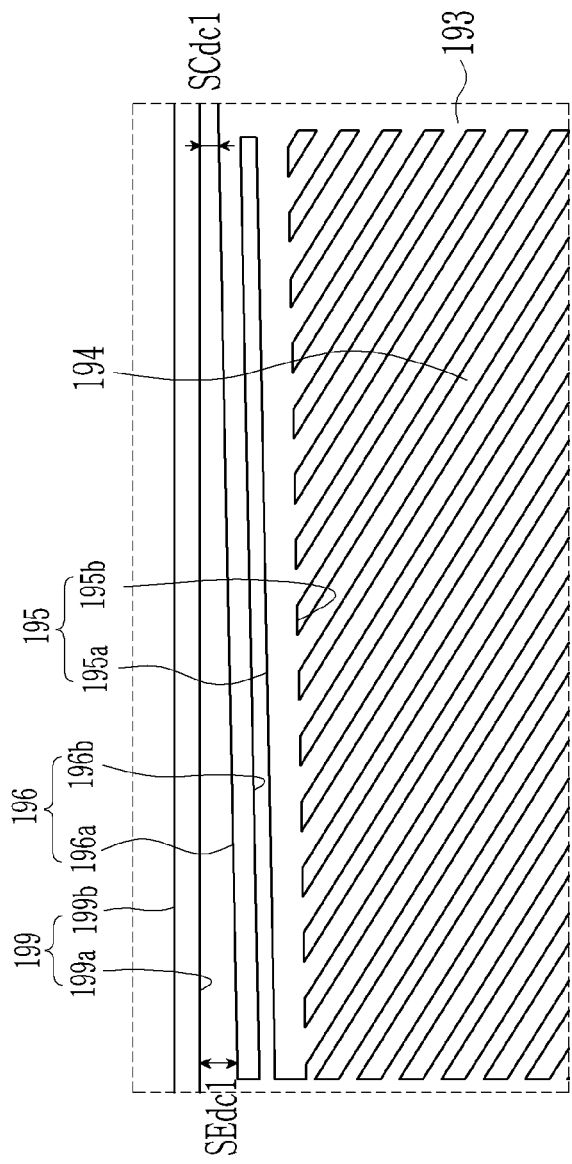
FIG. 19 is a plan view of an exemplary embodiment of a partial region of a partial layer of a display device.

The display device according to an exemplary embodiment shown in FIG. 19 is substantially the same as the display device according to an exemplary embodiment shown in FIG. 18 such that the repeated description thereof is omitted. In the illustrated exemplary embodiment, the plane shape of the storage electrode line and the outer branch part is different from the foregoing exemplary embodiment, and this will be described in detail.

FIG. 19 is a plan view of a partial region of a partial layer of a display device according to an exemplary embodiment. FIG. 19 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The distance from the center part of at least one side of the dummy branch part 196 to at least one side of the storage electrode line 199 is different from the distance from the edge part of at least one side of the dummy branch part 196 to at least one side of the storage electrode line 199. Also, the width of the outer branch part 195 is uniform, the width of the dummy branch part 196 is uniform, and the width of the storage electrode line 199 is uniform along the transverse direction.

The distance SCdc1 from the center part of the dummy branch part 196 to the first side 199a of the storage electrode line 199 is different from the distance SEdc1 from the edge part of the dummy branch part 196 to the first side 199a of the storage electrode line 199. The distance SCdc1 from the center part of the dummy branch part 196 to the first side 199a of the storage electrode line 199 is shorter than the distance SEdc1 from the edge part of the dummy branch part 196 to the first side 199a of the storage electrode line 199. The distance between the dummy branch part 196 and the storage electrode line 199 gradually increases from the center part of the dummy branch part 196 toward the edge part of the dummy branch part 196. The dummy branch part 196 is provided with the shape that is inclined with respect to the storage electrode line 199.

The width of the outer branch part 195 is uniform along the transverse direction. The outer branch part 195 is provided with the shape that is inclined with respect to the storage electrode line 199.

The width of the dummy branch part 196 is uniform along the transverse direction. The distance between the outer branch part 195 and the dummy branch part 196 is uniform along the transverse direction.

The width of the storage electrode line 199 is uniform along the transverse direction.

In the illustrated exemplary embodiment, as the outer branch part 195 and the dummy branch part 196 have the shape that is inclined with respect to the storage electrode line 199, the lateral field may be generated between the dummy branch part 196 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 20.

Figure 20:
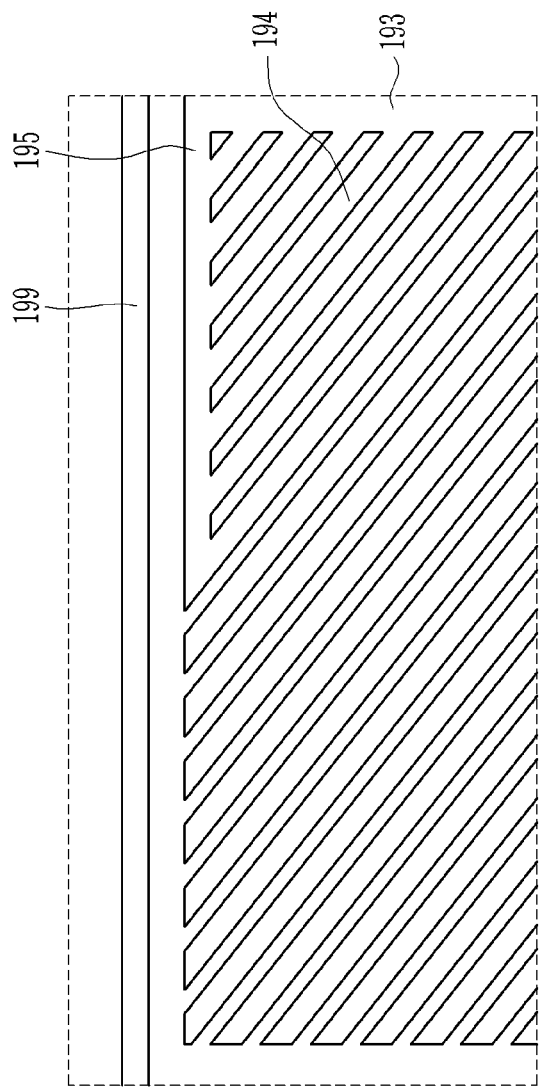
FIG. 20 is a plan view of an exemplary embodiment of a partial region of a partial layer of a display device.

The display device according to an exemplary embodiment shown in FIG. 20 is substantially the same as the display device according to an exemplary embodiment shown in FIGS. 1 to 4 such that the repeated description thereof is omitted. In the illustrated exemplary embodiment, the plane shape of the outer branch part is different from the foregoing exemplary embodiment, and this will be described in detail.

FIG. 20 is a plan view of a partial region of a partial layer of a display device according to an exemplary embodiment. FIG. 20 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The pixel electrode 191 includes a plurality of minute branch parts 194, and the outer branch part 195 connects at least some among the plurality of minute branch parts 194.

In the foregoing exemplary embodiment, the length of the outer branch part 195 corresponds to the length of the transverse branch part 192 (refer to FIG. 7), and the outer branch part 195 connects all minute branch parts 194 positioned on the upper edge of the pixel electrode 191. In the illustrated exemplary embodiment, the length of the outer branch part 195 corresponds to about half of the length of the transverse branch part 192 (refer to FIG. 7), and the outer branch part 195 connects a portion of the minute branch parts 194 positioned on the upper edge of the pixel electrode 191. The outer branch part 195 is not connected to a remaining of the minute branch parts 194 positioned on the upper edge of the pixel electrode 191. That is, the outer branch part 195 connects the portion of the minute branch parts 194 among the plurality of minute branch parts 194 adjacent to the storage electrode line 199 and does not connect a remaining of the minute branch parts 194. In the illustrated exemplary embodiment, the outer branch part 195 connects the portion of the minute branch parts 194 adjacent to the longitudinal branch part 193. The outer branch part 195 is positioned on the center part of the upper edge of the pixel electrode 191.

In the illustrated exemplary embodiment, as the outer branch part 195 is provided not to be connected to some among the plurality of minute branch parts 194 adjacent to the storage electrode line 199, the lateral field may be generated between the minute branch parts 194 that are not connected to the outer branch part 195 and the storage electrode line 199. Accordingly, the control force of the LC may be improved on the end part of the minute branch part 194, and the texture may be prevented on the edge of the pixel electrode 191.

Next, the display device according to an exemplary embodiment will be described with reference to FIG. 21.

Figure 21:
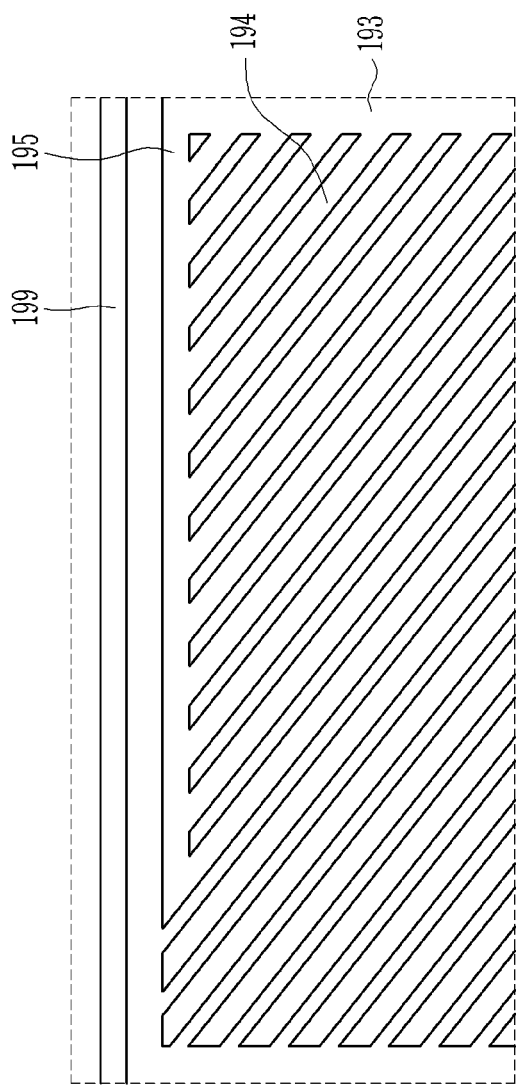
FIG. 21 is a plan view of an exemplary embodiment of a partial region of a partial layer of a display device.

The display device according to an exemplary embodiment shown in FIG. 21 is substantially the same as the display device according to an exemplary embodiment shown in FIG. 20 such that the repeated description thereof is omitted. In the illustrated exemplary embodiment, the planar shape of the outer branch part is different from the foregoing exemplary embodiment, and this will be described in detail.

FIG. 21 is a plan view of a partial region of a partial layer of a display device according to an exemplary embodiment. FIG. 21 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The outer branch part 195 connects a portion of the minute branch parts 194 among the plurality of minute branch parts 194 adjacent to the storage electrode line 199 and does not connect a remaining of the minute branch parts 194.

In the foregoing exemplary embodiment of FIG. 20, the length of the outer branch part 195 corresponds to about half of the length of the transverse branch part 192 (refer to FIG. 7), while in the illustrated exemplary embodiment, the length of the outer branch part 195 is longer than that in the foregoing exemplary embodiment of FIG. 20.

Next, the display device according to an exemplary embodiment will be described with reference to FIG. 22.

Figure 22:
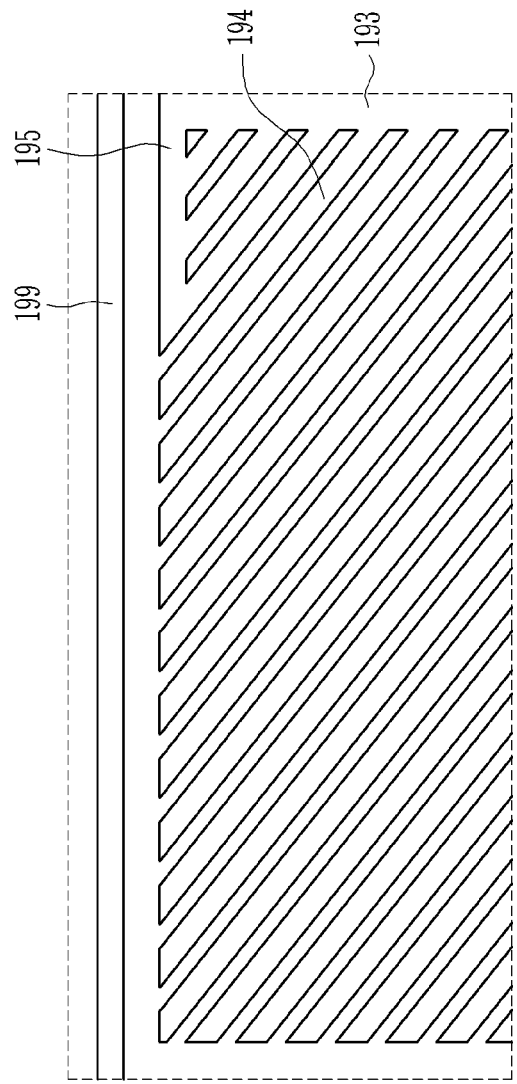
FIG. 22 is a plan view of an exemplary embodiment of a partial region of a partial layer of a display device

The display device according to an exemplary embodiment shown in FIG. 22 is substantially the same as the display device according to an exemplary embodiment shown in FIG. 20 such that the repeated description thereof is omitted. In the illustrated exemplary embodiment, the plane shape of the outer branch part is different from the foregoing exemplary embodiment, and this will be described in detail.

FIG. 22 is a plan view of a partial region of a partial layer of a display device according to an exemplary embodiment. FIG. 22 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The outer branch part 195 connects a portion of the minute branch parts 194 among the plurality of minute branch parts 194 adjacent to the storage electrode line 199 and does not connect a remaining of the minute branch parts 194.

In the foregoing exemplary embodiment of FIG. 20, the length of the outer branch part 195 corresponds to about half of the length of the transverse branch part 192 (refer to FIG. 7), while in the illustrated exemplary embodiment, the length of the outer branch part 195 is shorter than that in the foregoing exemplary embodiment of FIG. 20. That is, the length of the outer branch part 195 may be variously changed.

Next, the display device according to an exemplary embodiment will be described with reference to FIG. 23.

Figure 23:
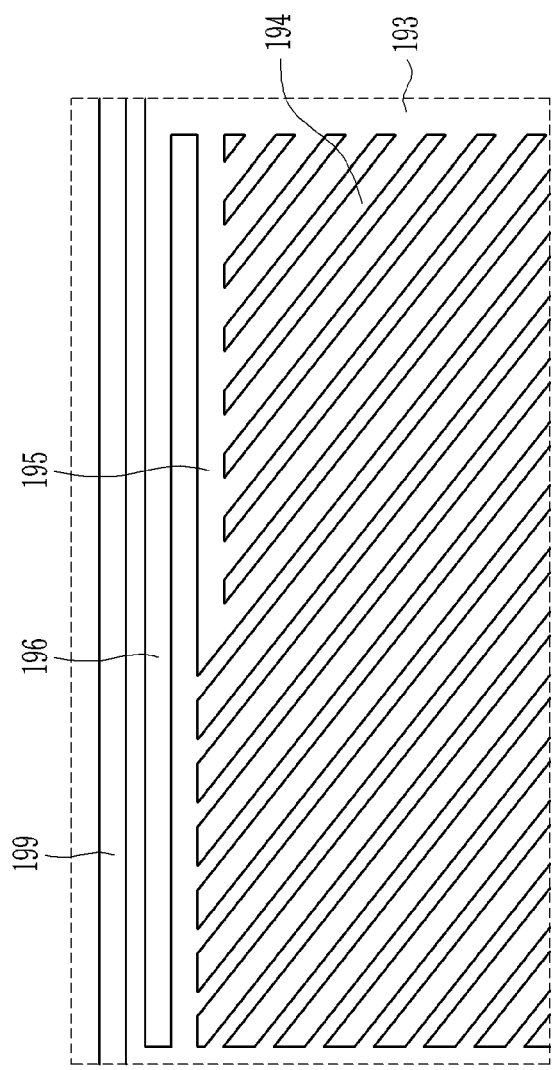
FIG. 23 is a plan view of an exemplary embodiment of a partial region of a partial layer of a display device.

The display device according to an exemplary embodiment shown in FIG. 23 is substantially the same as the display device according to an exemplary embodiment shown in FIG. 20 such that the repeated description thereof is omitted. In the illustrated exemplary embodiment, the plane shape of the outer branch part is different from the foregoing exemplary embodiment, and this will be described in detail.

FIG. 23 is a plan view of a partial region of a partial layer of a display device according to an exemplary embodiment. FIG. 23 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, and the outer branch part 195. The storage electrode line 199 is positioned to be separated from the pixel electrode 191.

The outer branch part 195 connects a portion of the minute branch parts 194 among the plurality of minute branch parts 194 adjacent to the storage electrode line 199 and does not connect a remaining of the minute branch parts 194.

The pixel electrode 191 further includes a dummy branch part 196. The dummy branch part 196 is positioned between the outer branch part 195 and the storage electrode line 199. The dummy branch part 196 may mainly extend in the transverse direction. The length of the dummy branch part 196 may correspond to the length of the transverse branch part 192 (refer to FIG. 7). However, the invention is not limited thereto, and the length of the dummy branch part 196 may be shorter than shown and may correspond to the length of the outer branch part 195.

Next, the display device according to an exemplary embodiment will be described with reference to FIG. 24.

Figure 24:
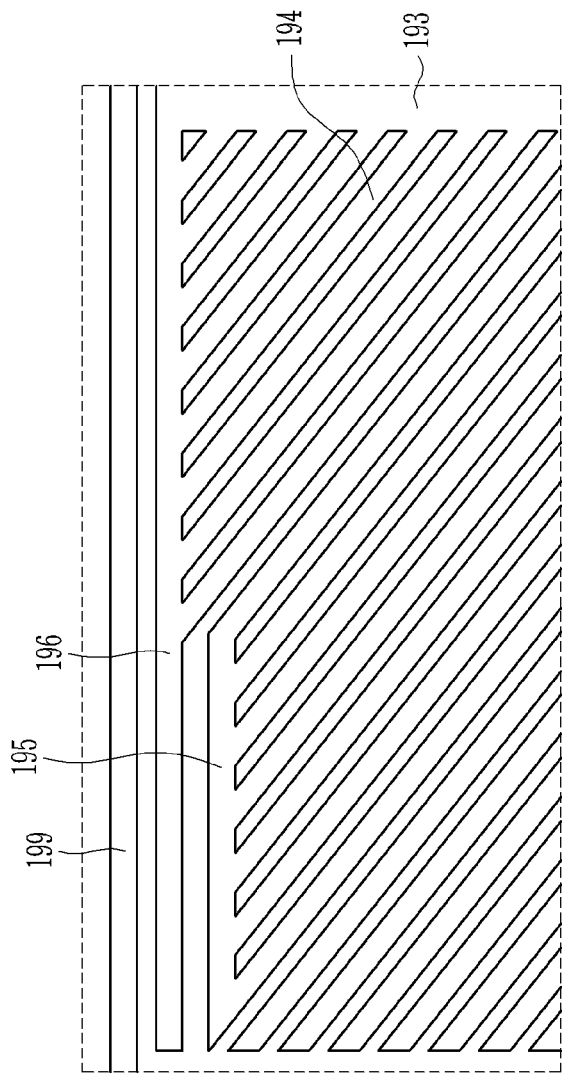
FIG. 24 is a plan view of an exemplary embodiment of a partial region of a partial layer of a display device.

The display device according to an exemplary embodiment shown in FIG. 24 is substantially the same as the display device according to an exemplary embodiment shown in FIG. 23 such that the repeated description thereof is omitted. In the illustrated exemplary embodiment, the plane shape of the outer branch part is different from the foregoing exemplary embodiment, and this will be described in detail.

FIG. 24 is a plan view of a partial region of a partial layer of a display device according to an exemplary embodiment. FIG. 24 shows the sub-region positioned at the left-upper side and the storage electrode line adjacent thereto among four sub-regions of the pixel electrode of the display device according to an exemplary embodiment.

Like the foregoing exemplary embodiment, the pixel electrode 191 (refer to FIG. 7) includes the transverse branch part 192 (refer to FIG. 7), the longitudinal branch part 193, the minute branch part 194, the outer branch part 195, and the dummy branch part 196. The storage electrode line 199 is positioned to be separated from the pixel electrode 191.

The outer branch part 195 connects a portion of the minute branch parts 194 among the plurality of minute branch parts 194 adjacent to the storage electrode line 199 and does not connect a remaining of the minute branch parts 194.

In the foregoing exemplary embodiment, the outer branch part 195 connects the portion of the minute branch parts 194 to the longitudinal branch part 193, and the outer branch part 195 is positioned at the center part of the upper edge of the pixel electrode 191. In the illustrated exemplary embodiment, the outer branch part 195 does not connect a portion of the minute branch parts 194 adjacent to the longitudinal branch part 193 and connects a portion of the minute branch parts 194 far from the longitudinal branch part 193. The portion of the minute branch parts 194 adjacent to the longitudinal branch part 193 are connected to the dummy branch part 196. The portion of the minute branch parts 194 among the plurality of minute branch parts 194 positioned at the upper edge of the pixel electrode 191 are connected to the outer branch part 195, and a remaining of the minute branch parts 194 are connected to the dummy branch part 196.

The display device according to the exemplary embodiment shown in FIGS. 20 to 24 shows a structure in which the portion of the minute branches among the plurality of minute branches adjacent to the storage electrode line are not connected by the outer branch part. In each exemplary embodiment, it is shown that the width of the outer branch part and the storage electrode line is uniform and the distance between the outer branch part and the storage electrode line is uniform along the transverse direction. However, the invention is not limited thereto, and like the display device according to the exemplary embodiment shown in FIGS. 1 to 19, the distance from the center part of at least one side of the outer branch part to at least one side of the storage electrode line may be different from the distance from the edge part of the outer branch part to at least one side of the storage electrode line. Also, the width of the outer branch part may not be uniform, and the width of the storage electrode line may not be uniform. Further, the distance from the center part of at least one side of the dummy branch part to at least one side of the storage electrode line may be different from the distance from the edge part of at least one side of the dummy branch part to at least one side of the storage electrode line. In addition, the width of the dummy branch part may not be uniform.

Next, the display device according to an exemplary embodiment will be described with reference to FIG. 25.

Figure 25:
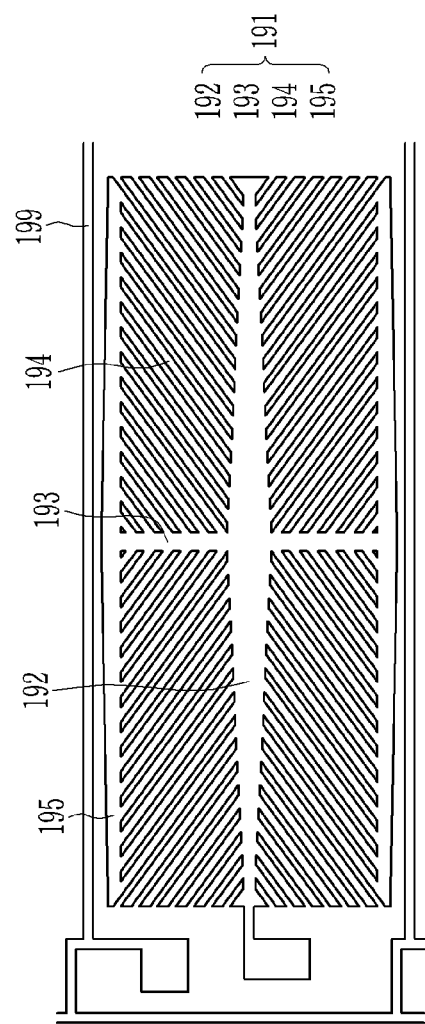
FIG. 25 is a plan view of an exemplary embodiment of a partial layer of a display device.

The display device according to an exemplary embodiment shown in FIG. 25 is substantially the same as the display device according to an exemplary embodiment shown in FIGS. 1 to 4 such that the repeated description thereof is omitted. In the illustrated exemplary embodiment, the plane shape of the transverse branch part is different from the foregoing exemplary embodiment, and this will be described in detail.

FIG. 25 is a plan view of a partial layer of a display device according to an exemplary embodiment. FIG. 25 shows the pixel electrode and the storage electrode line of the display device according to an exemplary embodiment.

Like the foregoing exemplary embodiment, the pixel electrode 191 includes the transverse branch part 192, longitudinal branch part 193, the minute branch part 194, and the outer branch part 195. The storage electrode line 199 is positioned to be separated from the pixel electrode 191. The distance from the center part of at least one side of the outer branch part 195 to at least one side of the storage electrode line 199 is different from the distance from the edge part of at least one side of the outer branch part 195 to the storage electrode line 199.

In the foregoing exemplary embodiment, the transverse branch part 192 has the uniform width along the transverse direction, while in the illustrated exemplary embodiment, the width of the transverse branch part 192 is differentiated depending on the position along the transverse direction.

The transverse branch part 192 has the widest width on the center part and has the narrowest width on the edge part. The center part of the transverse branch part 192 means the part where the transverse branch part 192 and the longitudinal branch part 193 are crossed. The edge part of the transverse branch part 192 means the part positioned farthest from the longitudinal branch part 193 along the transverse direction. The width gradually decreases from the center part of the transverse branch part 192 toward the edge part of the transverse branch part 192.

In the illustrated exemplary embodiment, as the width of the transverse branch part 192 is differentiated depending on the position in the transverse direction, the control force of the LC on the boundary between the minute branch part 194 and the transverse branch part 192 may be improved, and the generation of the texture may be prevented.

Next, the display device according to an exemplary embodiment will be described with reference to FIG. 26.

Figure 26:
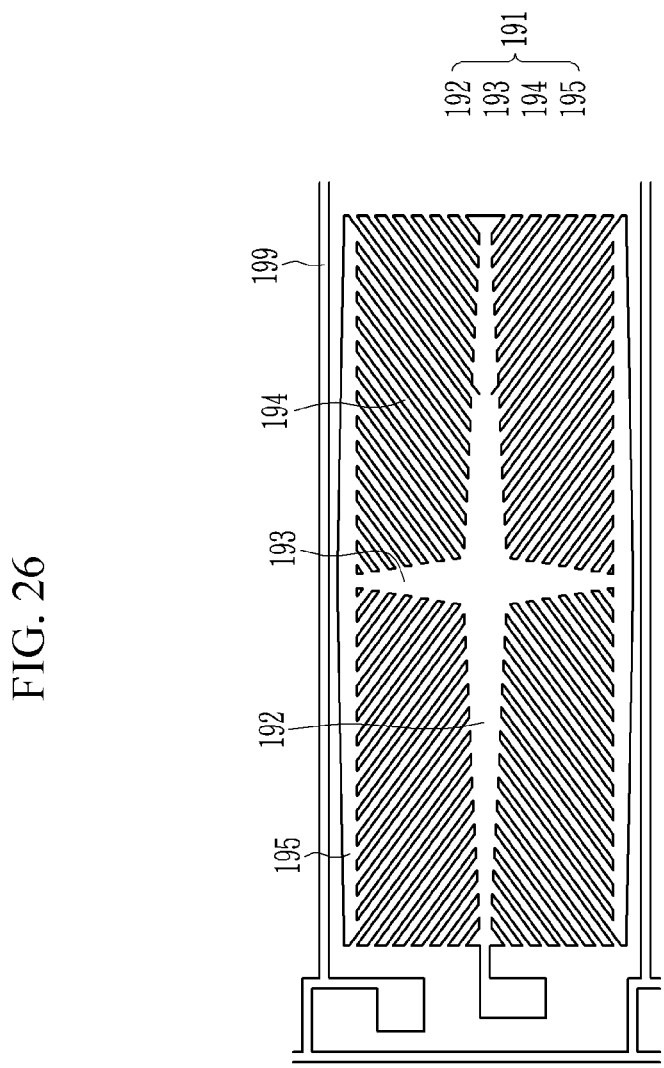
FIG. 26 is a plan view of an exemplary embodiment of a partial layer of a display device.

The display device according to an exemplary embodiment shown in FIG. 26 is substantially the same as the display device according to an exemplary embodiment shown in FIG. 25 such that the repeated description thereof is omitted. In the illustrated exemplary embodiment, the plane shape of the longitudinal branch part is different from the foregoing exemplary embodiment, and this will be described in detail.

FIG. 26 is a plan view of a partial layer of a display device according to an exemplary embodiment. FIG. 26 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195, and the width of the transverse branch part 192 is differentiated depending on the position along the transverse direction. The storage electrode line 199 is positioned to be separated from the pixel electrode 191.

In the foregoing exemplary embodiment, the longitudinal branch part 193 has the uniform width, while in the illustrated exemplary embodiment, the width of the longitudinal branch part 193 is differentiated depending on the position along the longitudinal direction.

The longitudinal branch part 193 has the widest width on the center part and has the narrowest width on the edge part. The center part of the longitudinal branch part 193 means the part where the longitudinal branch part 193 is crossed with the transverse branch part 192. The edge part of the longitudinal branch part 193 means the part positioned farthest from the transverse branch part 192 in a longitudinal direction. The width gradually decreases from the center part of the longitudinal branch part 193 toward the edge part of the longitudinal branch part 193.

In the illustrated exemplary embodiment, as the width of the transverse branch part 192 and the width of the longitudinal branch part 193 are differentiated depending on the position in the transverse and longitudinal direction directions, respectively, the control force of the LC may be improved on the boundary between the minute branch part 194 and the transverse branch part 192 and the boundary between the minute branch part 194 and the longitudinal branch part 193, and the texture may be prevented.

Next, the display device according to an exemplary embodiment will be described with reference to FIG. 27.

Figure 27:
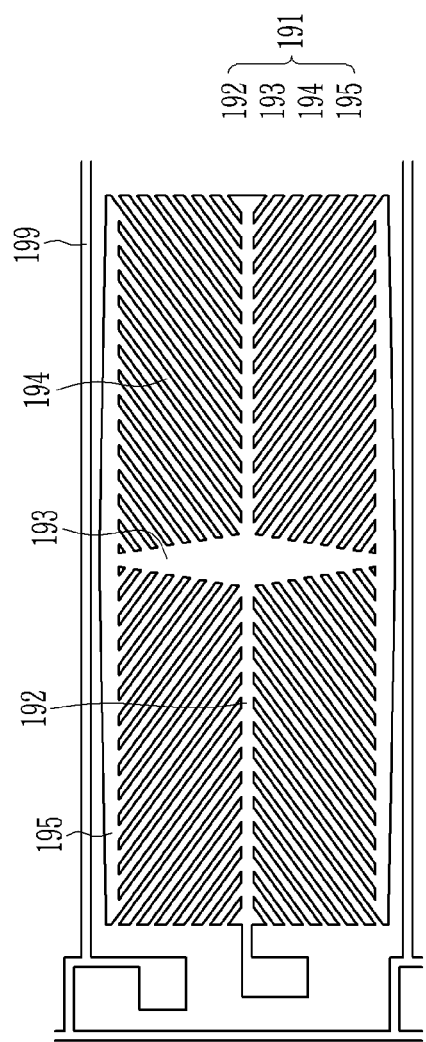
FIG. 27 is a plan view of an exemplary embodiment of a partial layer of a display device.

The display device according to an exemplary embodiment shown in FIG. 27 is substantially the same as the display device according to an exemplary embodiment shown in FIG. 25 such that the repeated description thereof is omitted. In the illustrated exemplary embodiment, the plane shape of the transverse branch part and the longitudinal branch part is different from the foregoing exemplary embodiment, and this will be described in detail.

FIG. 27 is a plan view of a partial layer of a display device according to an exemplary embodiment. FIG. 27 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191.

In the foregoing exemplary embodiment, the width of the transverse branch part 192 is differentiated depending on the position along the transverse direction, while in the illustrated exemplary embodiment, the transverse branch part 192 has the uniform width along the transverse direction.

In the foregoing exemplary embodiment, the longitudinal branch part 193 has the uniform width, while in the illustrated exemplary embodiment, the width of the longitudinal branch part 193 is differentiated depending on the position along the longitudinal direction.

The longitudinal branch part 193 has the widest width on the center part and has the narrowest width on the edge part. The width gradually decreases from the center part of the longitudinal branch part 193 toward the edge part of the longitudinal branch part 193.

In the illustrated exemplary embodiment, as the width of the longitudinal branch part 193 is differentiated depending on the position along the longitudinal direction, the control force of the LC may be improved on the boundary between the minute branch part 194 and the longitudinal branch part 193, and the texture may be prevented.

Next, the display device according to an exemplary embodiment will be described with reference to FIG. 28.

Figure 28:
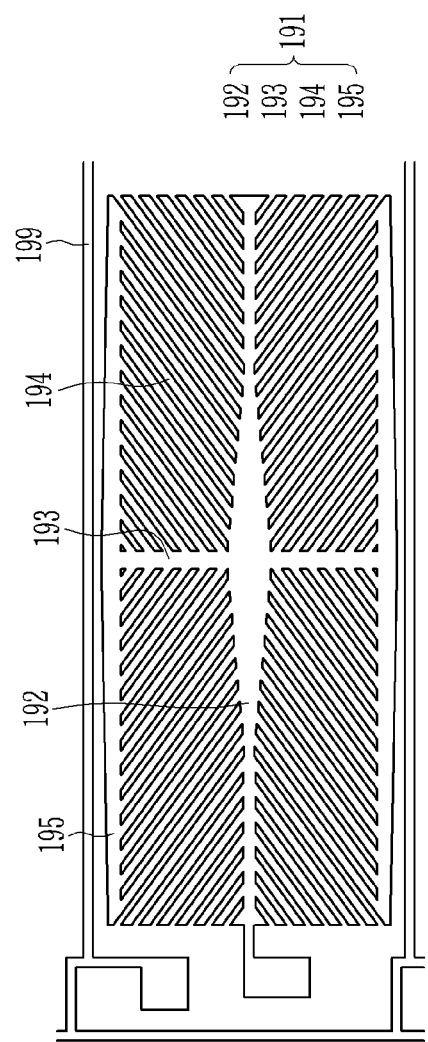
FIG. 28 is a plan view of an exemplary embodiment of a partial layer of a display device.

The display device according to an exemplary embodiment shown in FIG. 28 is substantially the same as the display device according to an exemplary embodiment shown in FIG. 25 such that the repeated description thereof is omitted. In the illustrated exemplary embodiment, the plane shape of the transverse branch part is different from the foregoing exemplary embodiment, and this will be described in detail.

FIG. 28 is a plan view of a partial layer of a display device according to an exemplary embodiment. FIG. 28 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191.

In the foregoing exemplary embodiment, the transverse branch part 192 is provided with the shape of which the width gradually decreases from the center part toward the edge part, while in the illustrated exemplary embodiment, the transverse branch part 192 is provided with the shape of which the width gradually decreases from the center part to a predetermined region positioned between the center part and the edge part. The uniform width is provided from the predetermined region positioned between the center part and the edge part of the transverse branch part 192 to the edge part of the transverse branch part 192.

It is shown that the predetermined region between the center part and the edge part of the transverse branch part 192 is an approximate center position between the center part and the edge part, but the invention is not limited thereto. The predetermined region may be nearer to the center part or may be nearer to the edge part.

Next, the display device according to an exemplary embodiment will be described with reference to FIG. 29.

Figure 29:
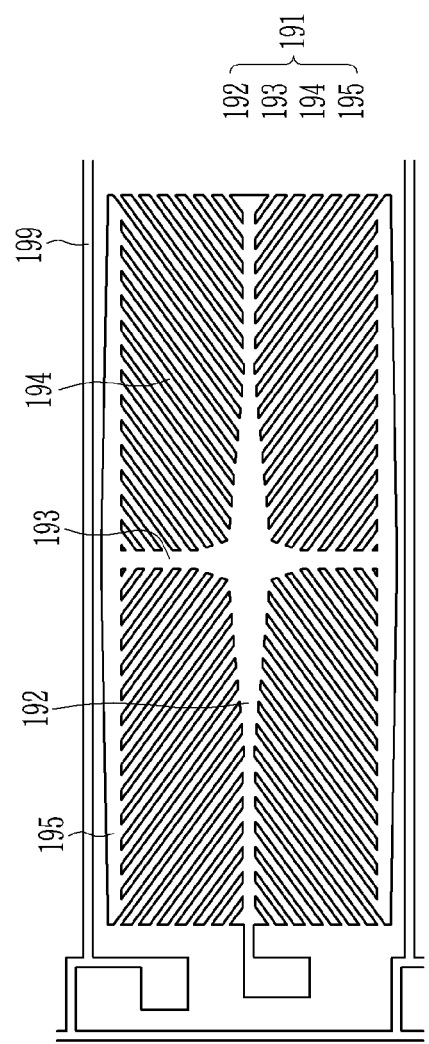
FIG. 29 is a plan view of an exemplary embodiment of a partial layer of a display device.

The display device according to an exemplary embodiment shown in FIG. 29 is substantially the same as the display device according to an exemplary embodiment shown in FIG. 26 such that the repeated description thereof is omitted. In the illustrated exemplary embodiment, the plane shape of the transverse branch part and the longitudinal branch part is different from the foregoing exemplary embodiment, and this will be described in detail.

FIG. 29 is a plan view of a partial layer of a display device according to an exemplary embodiment. FIG. 29 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191.

In the foregoing exemplary embodiment, the transverse branch part 192 and the longitudinal branch part 193 are provided with the shape of which the width gradually decreases from the center part toward the edge part. In the illustrated exemplary embodiment, the transverse branch part 192 is provided with the shape of which the width gradually decreases from the center part to a predetermined region positioned between the center part and the edge part. The uniform width is provided from the predetermined region positioned between the center part and the edge part of the transverse branch part 192 to the edge part of the transverse branch part 192. The longitudinal branch part 193 is provided with the shape of which the width gradually decreases from the center part to a predetermined region positioned between the center part and the edge part. The uniform width is provided from the predetermined region positioned between the center part and the edge part of the longitudinal branch part 193 to the edge part of the longitudinal branch part 193.

It is shown that the predetermined region between the center part and the edge part of the longitudinal branch part 193 is the approximate center position between the center part and the edge part, but the invention is not limited thereto. The predetermined region may be nearer to the center part, and may be nearer to the edge part.

Next, the display device according to an exemplary embodiment will be described with reference to FIG. 30.

Figure 30:
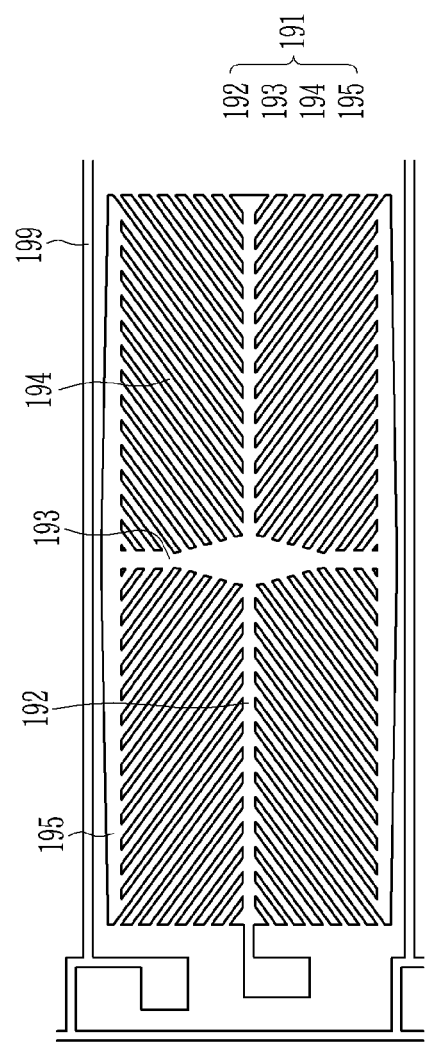
FIG. 30 is a plan view of an exemplary embodiment of a partial layer of a display device.

The display device according to an exemplary embodiment shown in FIG. 30 is substantially the same as the display device according to an exemplary embodiment shown in FIG. 27 such that the repeated description thereof is omitted. In the illustrated exemplary embodiment, the plane shape of the longitudinal branch part is different from the foregoing exemplary embodiment, and this will be described in detail.

FIG. 30 is a plan view of a partial layer of a display device according to an exemplary embodiment. FIG. 30 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191.

In the foregoing exemplary embodiment, the longitudinal branch part 193 is provided with the shape of which the width gradually decreases from the center part toward the edge part, while in the illustrated exemplary embodiment, the longitudinal branch part 193 is provided with the shape of which the width gradually decreases from the center part to a predetermined region positioned between the center part and the edge part along the longitudinal direction. The uniform width is provided from the predetermined region positioned between the center part and the edge part of the longitudinal branch part 193 to the edge part of the longitudinal branch part 193.

It is shown that the predetermined region between the center part and the edge part of the longitudinal branch part 193 is the approximate center position between the center part and the edge part, but the invention is not limited thereto. The predetermined region may be nearer to the center part, and may be nearer to the edge part.

Next, the display device according to an exemplary embodiment will be described with reference to FIG. 31.

Figure 31:
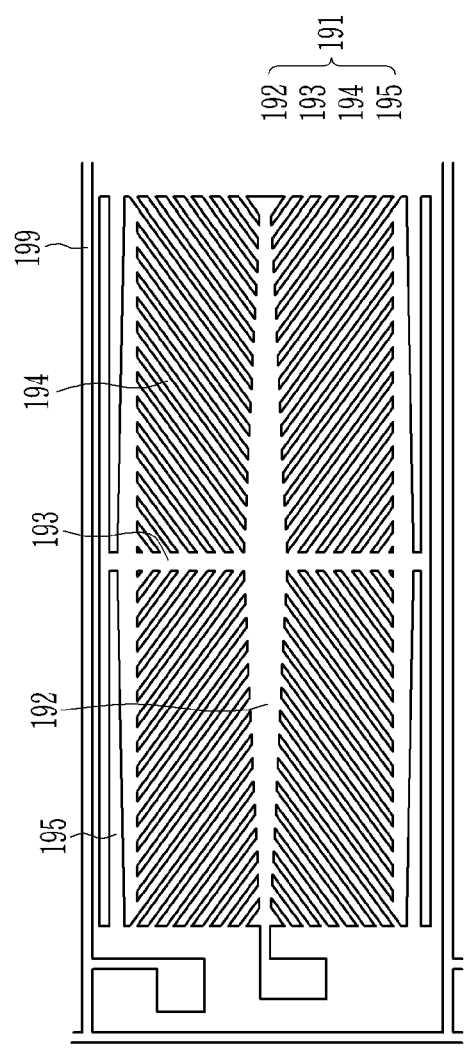
FIG. 31 is a plan view of an exemplary embodiment of a partial layer of a display device.

The display device according to an exemplary embodiment shown in FIG. 31 is substantially the same as the display device according to an exemplary embodiment shown in FIG. 25 such that the repeated description thereof is omitted. In the illustrated exemplary embodiment, the pixel electrode including the dummy branch part is different from the foregoing exemplary embodiment, and this will be described in detail.

FIG. 31 is a plan view of a partial layer of a display device according to an exemplary embodiment. FIG. 31 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195, and the width of the transverse branch part 192 is differentiated depending on the position along the transverse direction. The storage electrode line 199 is positioned to be separated from the pixel electrode 191.

The pixel electrode 191 further includes a dummy branch part 196. The dummy branch part 196 is positioned between the outer branch part 195 and the storage electrode line 199. The dummy branch part 196 may mainly extend in the transverse direction. The dummy branch part 196 may be positioned at the upper edge and the lower edge of the pixel electrode 191. Also, the dummy branch part 196 may be further positioned at the left edge and the right edge of the pixel electrode 191, and the dummy branch part 196 positioned at the left edge and the right edge of the pixel electrode 191 may extend in the longitudinal direction.

In the illustrated exemplary embodiment, the width of the transverse branch part 192 may gradually decrease from the center part toward the edge part, but the invention is not limited thereto. As shown in the exemplary embodiment of FIGS. 26 to 30, the width of the longitudinal branch part 193 may be changed, and the width of the transverse branch part 192 and the longitudinal branch part 193 may be gradually changed and may be uniform in another region.

The display device according to the exemplary embodiment shown in FIGS. 25 to 31 has the structure in which the width of one of the transverse branch part and the longitudinal branch part is differentiated depending on the position along the transverse and longitudinal directions. In each exemplary embodiment, it is shown that one side of the outer branch part has the inclination with respect to the storage electrode line. However, the invention is not limited thereto, as shown in FIGS. 5 to 24, the shape of the outer branch part and the storage electrode line may be variously changed. Also, the pixel electrode may further include the dummy branch part, and the shape of the dummy branch part may be variously changed.

Next, the display device according to an exemplary embodiment will be described with reference to FIG. 32.

Figure 32:
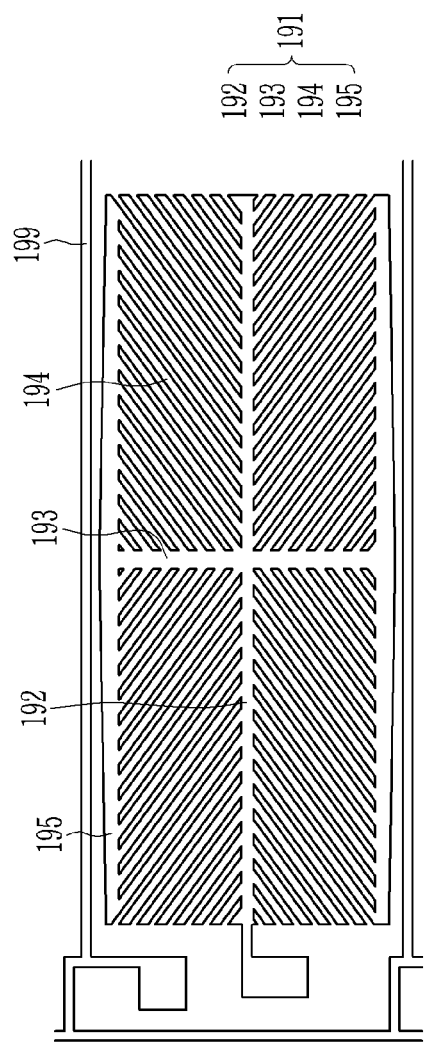
FIG. 32 is a plan view of an exemplary embodiment of a partial layer of a display device.

The display device according to an exemplary embodiment shown in FIG. 32 is substantially the same as the display device according to an exemplary embodiment shown in FIGS. 1 to 4 such that the repeated description thereof is omitted. In the illustrated exemplary embodiment, the plane shape of the minute branches is different from the foregoing exemplary embodiment, and this will be described in detail.

FIG. 32 is a plan view of a partial layer of a display device according to an exemplary embodiment. FIG. 32 shows the pixel electrode and the storage electrode line of the display device according to an exemplary embodiment.

Like the foregoing exemplary embodiment, the pixel electrode 191 includes the transverse branch part 192, the longitudinal branch part 193, the minute branch part 194, and the outer branch part 195. The storage electrode line 199 is positioned to be separated from the pixel electrode 191. The distance from the center part of at least one side of the outer branch part 195 to at least one side of the storage electrode line 199 is different from the distance from the edge part of at least one side of the outer branch part 195 to the storage electrode line 199.

The pixel electrode 191 is divided into four sub-regions by the transverse branch part 192 and the longitudinal branch part 193. In the foregoing exemplary embodiment, the minute branch parts 194 of two sub-regions positioned at the upper side and the minute branch parts 194 of two sub-regions positioned at the lower side are symmetric. In the illustrated exemplary embodiment, the minute branch parts 194 of two sub-regions positioned at the upper side and the minute branch parts 194 of two sub-regions positioned at the lower side are asymmetric. The minute branch parts 194 of two sub-regions positioned at the upper side and the minute branch parts 194 of two sub-regions positioned at the lower side may be disposed to be mismatched.

In the illustrated exemplary embodiment, it is shown that one side of the outer branch part is inclined with respect to the storage electrode line. However, the invention is not limited thereto, and as shown in FIGS. 5 to 24, the shape of the outer branch part and the storage electrode line may be variously changed. Also, the pixel electrode may further include the dummy branch part, and the shape of the dummy branch part may be variously changed.

Next, the display device according to an exemplary embodiment will be described with reference to FIGS. 33 and 34.

Figure 33:
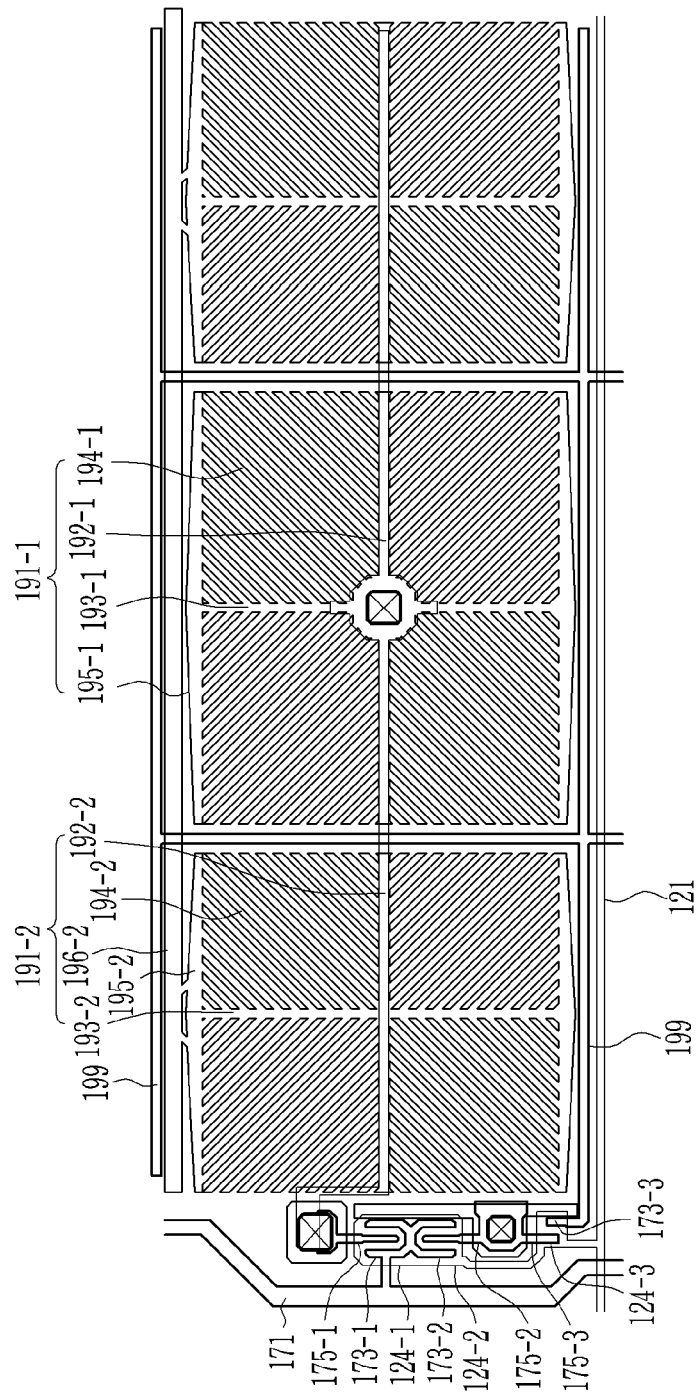
FIG. 33 is a plan view of an exemplary embodiment of a display device.
Figure 34:
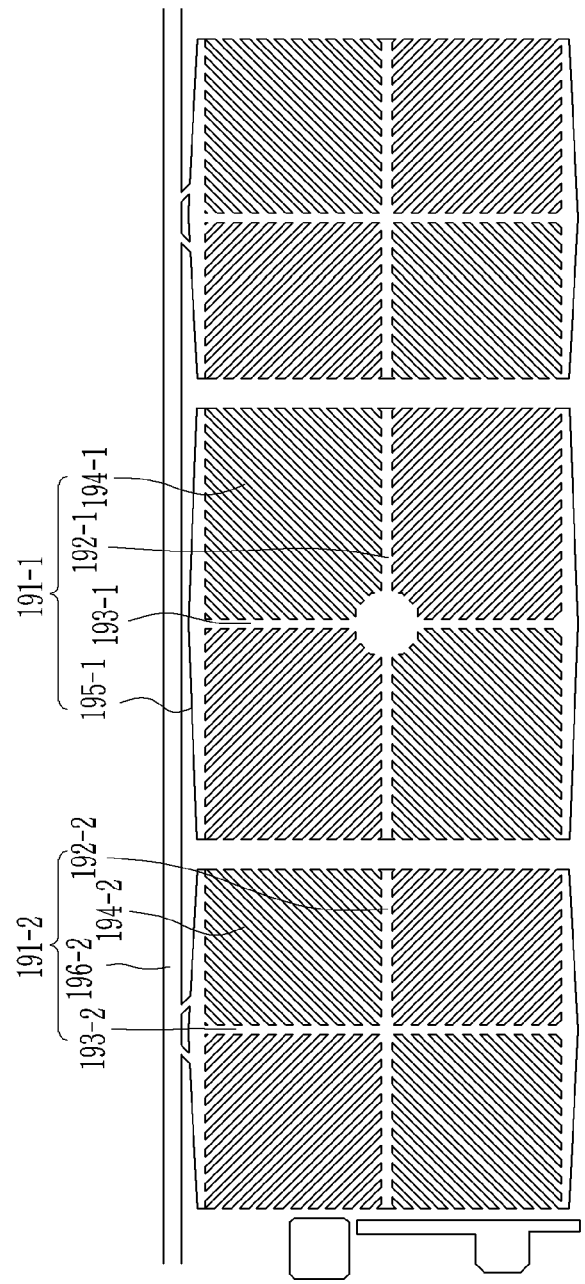
FIG. 34 is a plan view of an exemplary embodiment of a partial layer of a display device.

The display device according to an exemplary embodiment shown in FIGS. 33 and 34 is substantially the same as the display device according to an exemplary embodiment shown in FIGS. 1 to 4 such that the repeated description thereof is omitted. In the illustrated exemplary embodiment, the shape of the TFT and the pixel electrode is different from the foregoing exemplary embodiment, and this will be described in detail.

FIG. 33 is a plan view of a display device according to an exemplary embodiment, and FIG. 34 is a plan view of a partial layer of a display device according to an exemplary embodiment. FIG. 34 shows the pixel electrode of the display device according to an exemplary embodiment.

The gate line 121 and the data line 171 are crossed. A first gate electrode 124-1, a second gate electrode 124-2, and a third gate electrode 124-3 that are protruded from the gate line are provided. A first source electrode 173-1 and a second source electrode 173-2 that are protruded from the data line 171 are provided, and a first drain electrode 175-1 and a second drain electrode 175-2 that are separated from the first source electrode 173-1 and the second source electrode 173-2 are provided. The first source electrode 173-1 and the first drain electrode 175-1 overlap the first gate electrode 124-1, and the second source electrode 173-2 and the second drain electrode 175-2 overlap the second gate electrode 124-2.

The storage electrode line 199 is parallel to the gate line 121, and a third source electrode 173-3 connected to the storage electrode line 199 is provided. A third drain electrode 175-3 separated from the third source electrode 173-3 and connected to the second drain electrode 175-2 is provided. The third source electrode 173-3 and the third drain electrode 175-3 overlap the third gate electrode 124-3.

A first sub-pixel electrode 191-1 connected to the first drain electrode 175-1 is provided, and a second sub-pixel electrode 191-2 connected to the second drain electrode 175-2 is provided.

The first sub-pixel electrode 191-1 is substantially provided as a quadrangle, and includes a transverse branch part 192-1 and a longitudinal branch part 193-1. The first sub-pixel electrode 191-1 further includes minute branch parts 194-1 extending from the transverse branch part 192-1 and the longitudinal branch part 193-1, and an outer branch part 195-1 connecting the end parts of the minute branch parts 194-1.

The second sub-pixel electrode 191-2 is substantially provided as a quadrangle, and includes a transverse branch part 192-2 and a longitudinal branch part 193-2. The first sub-pixel electrode 191-2 further includes minute branch parts 194-2 extending from the transverse branch part 192-2 and the longitudinal branch part 193-2, and an outer branch part 195-2 connecting the end parts of the minute branch parts 194-2. The second sub-pixel electrode 191-2 further includes the dummy branch part 196-2 positioned between the outer branch part 195-2 and the storage electrode line 199. The second sub-pixel electrode 191-2 is positioned on both sides of the first sub-pixel electrode 191-1.

The distance from the center part of at least one side of the outer branch parts 195-1 and 195-2 to the storage electrode line 199 is different from the distance from the edge of at least one side of the outer branch parts 195-1 and 195-2 to the storage electrode line 199. The width of the outer branch parts 195-1 and 195-2 gradually decreases from the center part toward the edge part.

In the illustrated exemplary embodiment, it is shown that the one side of the outer branch part has the inclination with respect to the storage electrode line. However, the invention is not limited thereto, and as shown in FIGS. 5 to 24, the shape of the outer branch part, the dummy branch part, and the storage electrode line may be variously changed.

Next, the display device according to an exemplary embodiment will be described with reference to FIGS. 35 and 36.

Figure 35:
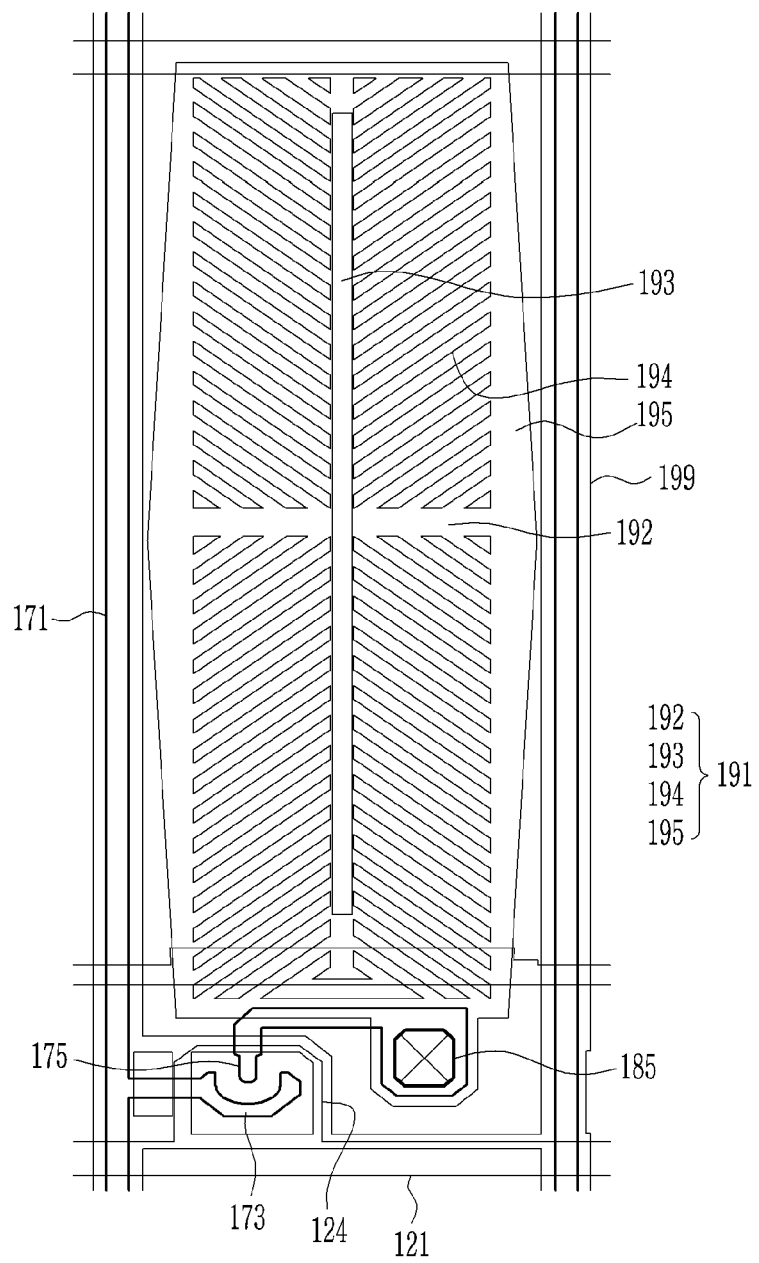
FIG. 35 is a plan view of an exemplary embodiment of a display device.
Figure 36:
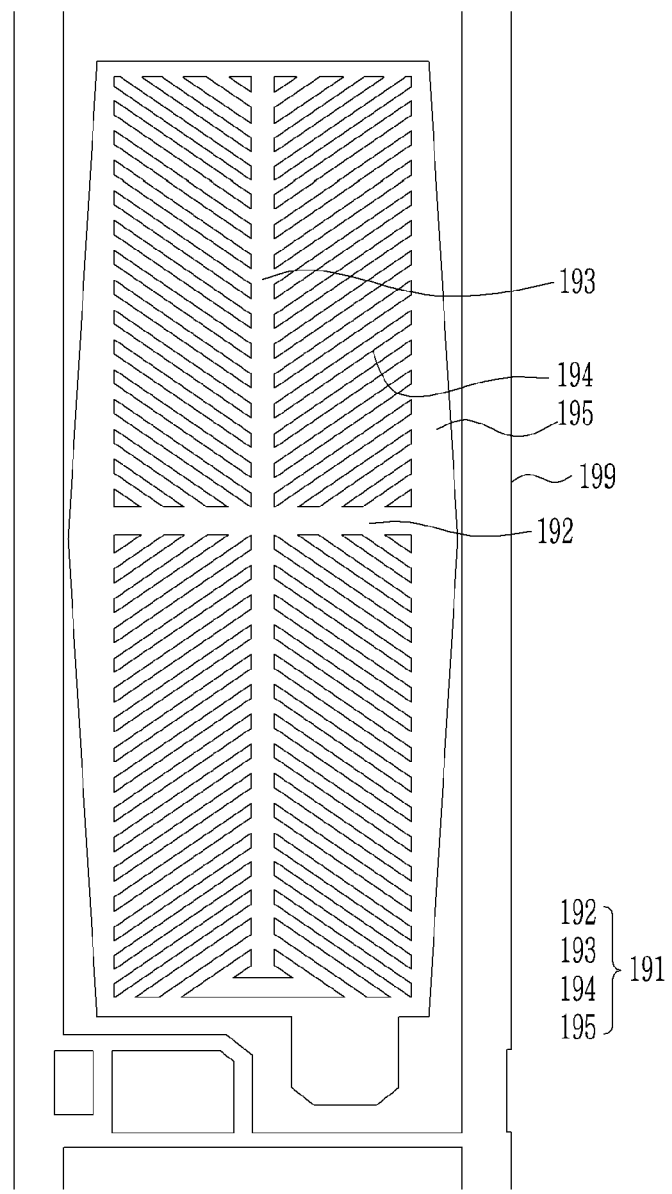
FIG. 36 is a plan view of an exemplary embodiment of a partial layer of a display device.

The display device according to an exemplary embodiment shown in FIGS. 35 and 36 is substantially the same as the display device according to an exemplary embodiment shown in FIGS. 1 to 4 such that the repeated description thereof is omitted. In the illustrated exemplary embodiment, the shape of the TFT and the pixel electrode is different from the foregoing exemplary embodiment, and this will be described in detail.

FIG. 35 is a plan view of a display device according to an exemplary embodiment, and FIG. 36 is a plan view of a partial layer of a display device according to an exemplary embodiment. FIG. 36 shows the pixel electrode of the display device according to an exemplary embodiment.

In the foregoing exemplary embodiment, the TFT is positioned at the left edge of the pixel, while in the illustrated exemplary embodiment, the TFT is positioned at the lower edge of the pixel. In the foregoing exemplary embodiment, the pixel electrode 191 has the shape in which the transverse branch part 192 is longer than the longitudinal branch part 193, while in the illustrated exemplary embodiment, the pixel electrode 191 has the shape in which the transverse branch part 192 is shorter than the longitudinal branch part 193.

The distance from the center part of at least one side of the outer branch part 195 to the storage electrode line 199 is different from the distance from the edge part of at least one side of the outer branch part 195 to the storage electrode line 199. The width of the outer branch part 195 gradually decreases from the center part toward the edge part.

Also, the shortest distance from the center part of at least one side of the outer branch part 195 to at least one side of the data line 171 is different from the shortest distance from the edge part of at least one side of the outer branch part 195 to at least one side of the data line 171.

In the illustrated exemplary embodiment, it is shown that the one side of the outer branch part has the inclination with respect to the storage electrode line. However, the invention is not limited thereto, and as shown in FIGS. 5 to 24, the shape of the outer branch part and the storage electrode line may be variously changed. Also, the pixel electrode may further include the dummy branch part, and the shape of the dummy branch part may be variously changed.

Next, the display device according to an exemplary embodiment will be described with reference to FIGS. 37 and 38.

Figure 37:
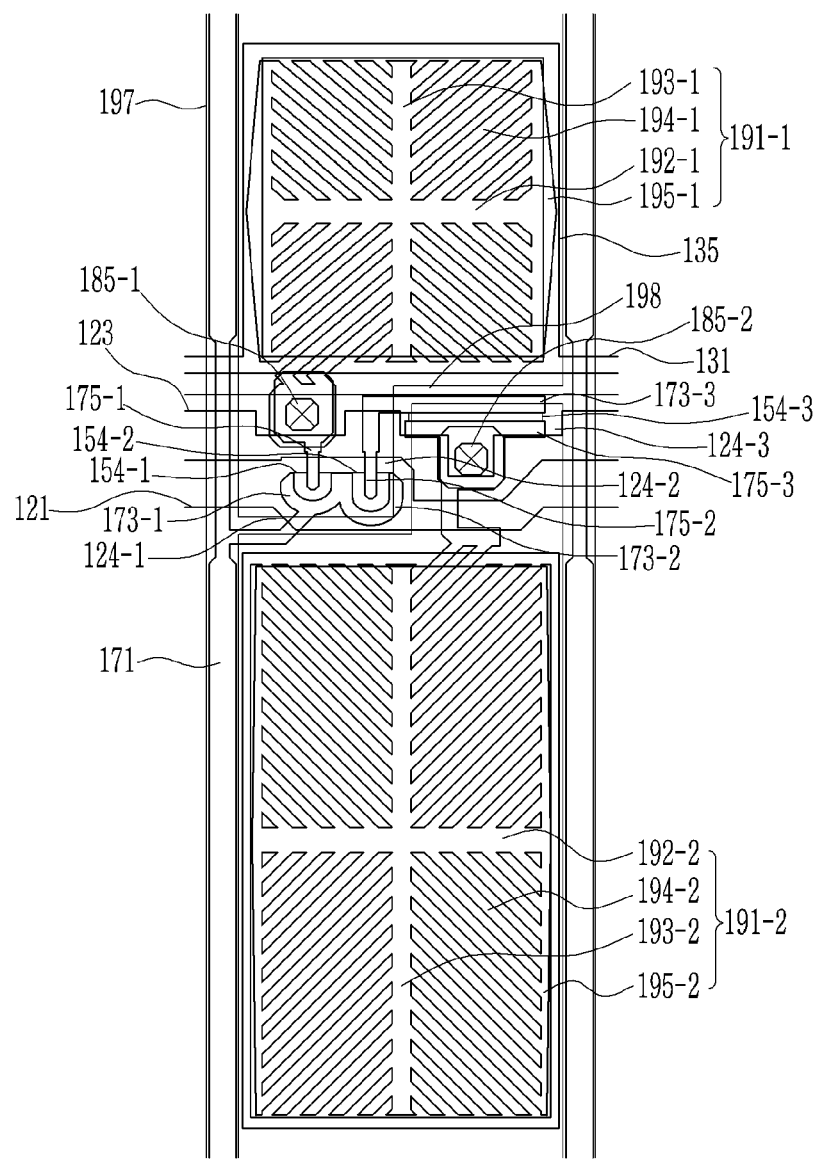
FIG. 37 is a plan view of an exemplary embodiment of a display device.
Figure 38:
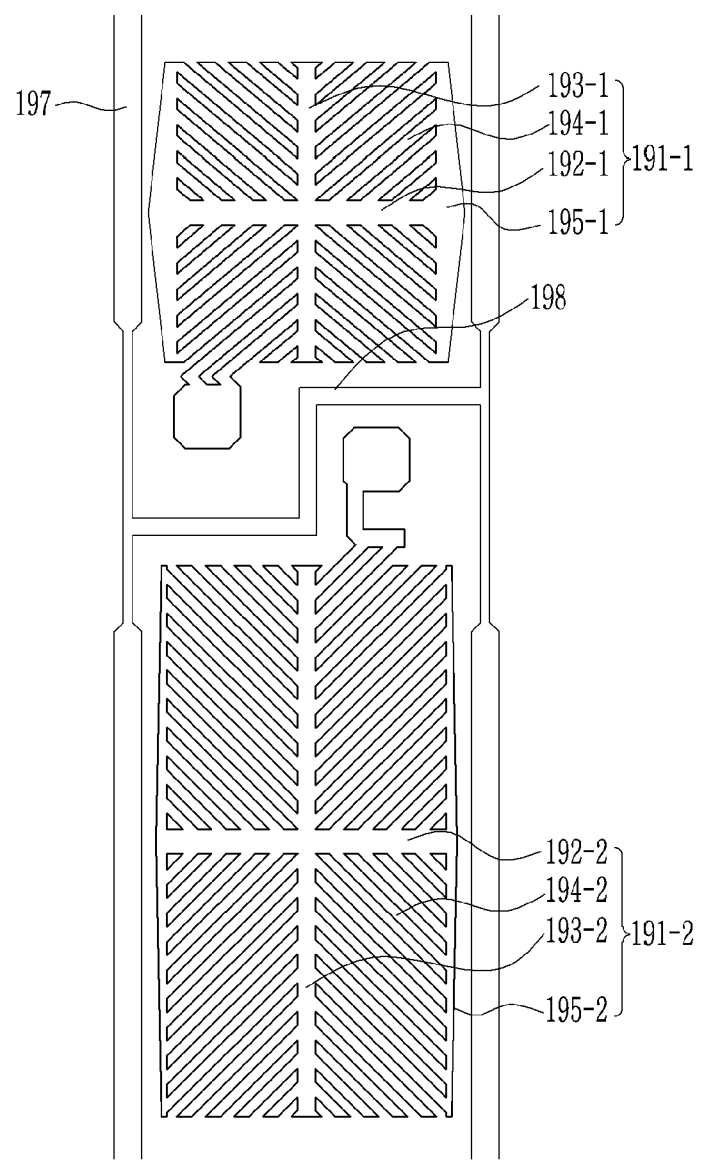
FIG. 38 is a plan view of an exemplary embodiment of a partial layer of a display device.

The display device according to an exemplary embodiment shown in FIGS. 37 and 38 is substantially the same as the display device according to an exemplary embodiment shown in FIGS. 1 to 4 such that the repeated description thereof is omitted. In the illustrated exemplary embodiment, the shape of the TFT and the pixel electrode is different from the foregoing exemplary embodiment, and this will be described in detail.

FIG. 37 is a plan view of a display device according to an exemplary embodiment, and FIG. 38 is a plan view of a partial layer of a display device according to an exemplary embodiment. FIG. 38 shows the pixel electrode of the display device according to an exemplary embodiment.

The gate lines 121, 123 and the data line 171 are crossed. The first gate electrode 124-1, the second gate electrode 124-2, and the third gate electrode 124-3 that are protruded from the gate lines 121 and 123 are provided. A first semiconductor layer 154-1 overlaps the first gate electrode 124-1, a second semiconductor layer 154-2 overlaps the second gate electrode 124-2, and a third semiconductor layer 154-3 overlaps the third gate electrode 124-3. The first source electrode 173-1 and the second source electrode 173-2 that are protruded from the data line 171 are provided, and the first drain electrode 175-1 and the second drain electrode 175-2 that are separated from the first source electrode 173-1 are provided. The first source electrode 173-1 and the first drain electrode 175-1 overlap the first gate electrode 124-1, and the second source electrode 173-2 and the second drain electrode 175-2 overlap the second gate electrode 124-2. The third source electrode 173-3 connected to the second drain electrode 175-2 is provided, and the third drain electrode 175-3 separated from the third source electrode 173-3 is provided. The third source electrode 173-3 and the third drain electrode 175-3 overlap the third gate electrode 124-3.

The first sub-pixel electrode 191-1 connected to the first drain electrode 175-1 through a contact hole 185-1 is provided, and the second sub-pixel electrode 191-2 connected to the second drain electrode 175-2 through a contact hole 185-2 is provided.

The first sub-pixel electrode 191-1 is substantially provided as a quadrangle, and includes the transverse branch part 192-1 and the longitudinal branch part 193-1. The first sub-pixel electrode 191-1 further includes the minute branch parts 194-1 extending from the transverse branch part 192-1 and the longitudinal branch part 193-1, and the outer branch part 195-1 connecting the end parts of the minute branch parts 194-1.

The second sub-pixel electrode 191-2 is substantially provided as a quadrangle, and includes the transverse branch part 192-2 and the longitudinal branch part 193-2. The first sub-pixel electrode 191-2 further includes the minute branch parts 194-2 extending from the transverse branch part 192-2 and the longitudinal branch part 193-2, and the outer branch part 195-2 connecting the end parts of the minute branch parts 194-2.

A first storage electrode line 131 is provided in the direction parallel to the gate line 121, and a second storage electrode line 135 protruded from the first storage electrode line 131 to enclose the first sub-pixel electrode 191-1 and the second sub-pixel electrode 191-2 is provided.

The distance from the center part of at least one side of the outer branch parts 195-1 and 195-2 to the second storage electrode line 135 is different from the distance from the edge part of at least one side of the outer branch parts 195-1 and 195-2 to the storage electrode line 135. The width of the outer branch parts 195-1 and 195-2 gradually decreases from the center part toward the edge part.

Also, the shortest distance from the center part of at least one side of the outer branch part 195 to at least one side of the data line 171 is different from the shortest distance from the edge part of at least one side of the outer branch part 195 to at least one side of the data line 171.

In the illustrated exemplary embodiment, it is shown that one side of the outer branch part has the inclination with respect to the storage electrode line. However, the invention is not limited thereto, and as shown in FIGS. 5 to 24, the shape of the outer branch part and the storage electrode line may be variously changed. Also, the pixel electrode may further include the dummy branch part, and the shape of the dummy branch part may be variously changed.

A shielding electrode 197 overlapping the data line 171 is provided, and a connection electrode 198 connecting adjacent shielding electrodes 197 to each other is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a first wiring and a second wiring disposed on the substrate;
   a thin film transistor connected to the first wiring and the second wiring; and
   a pixel electrode which is connected to the thin film transistor and includes:
   a transverse branch part;
   a longitudinal branch part;
   minute branches extending from the transverse branch part and the longitudinal branch part; and
   an outer branch part connecting end parts of the minute branches,
   wherein the outer branch part is disposed adjacent to the first wiring,
   the second wiring is extended in a substantially perpendicular direction to an extending direction of the first wiring, and
   a shortest distance from a center part of one side of the outer branch part to at least one side of the first wiring is different from a shortest distance from an edge part of the one side of the outer branch part to the one side of the first wiring.

2. The display device of claim 1, further comprising
   a storage electrode line adjacent to the outer branch part of the pixel electrode, and
   the shortest distance from the center part of at least one side of the outer branch part to at least one side of the storage electrode line is different from the shortest distance from the edge part of at least one side of the outer branch part to at least one side of the storage electrode line.

3. The display device of claim 2, wherein
   the storage electrode line overlaps the first wiring and extends in a direction parallel to the first wiring.

4. The display device of claim 3, wherein
   the thin film transistor includes a gate electrode, a source electrode, and a drain electrode,
   the first wiring is a gate line connected to the gate electrode, and
   the second wiring is a data line connected to the source electrode.

5. The display device of claim 3, wherein
   the thin film transistor includes a gate electrode, a source electrode, and a drain electrode,
   the first wiring is a data line connected to the source electrode, and
   the second wiring is a gate line connected to the gate electrode.

6. A display device comprising:
   a substrate;
   a first wiring and a second wiring disposed on the substrate;
   a thin film transistor connected to the first wiring and the second wiring; and a pixel electrode which is connected to the thin film transistor and includes:
a transverse branch part;
a longitudinal branch part;
minute branches extending from the transverse branch part and the longitudinal branch part;
an outer branch part connecting end parts of the minute branches; and
a storage electrode line adjacent to the outer branch part of the pixel electrode
wherein a shortest distance from a center part of at least one side of the outer branch part to at least one side of the storage electrode line is different from a shortest distance from an edge part of at least one side of the outer branch part to at least one side of the storage electrode line,
wherein
a width of the storage electrode line is uniform, and
a width of the outer branch part gradually decreases from a center part of the outer branch part toward an edge part of the outer branch part.

7. The display device of claim 6, wherein
the outer branch part includes a first side adjacent to the storage electrode line and a second side connected to the minute branches, and
a distance between the first side of the outer branch part and the storage electrode line gradually increases from the center part of the outer branch part toward the edge part of the outer branch part.

8. The display device of claim 7, wherein
a distance between the second side of the outer branch part and the storage electrode line is uniform.

9. The display device of claim 7, wherein
the distance between the second side of the outer branch part and the storage electrode line gradually decreases from the center part of the outer branch part toward the edge part of the outer branch part.

10. The display device of claim 6, wherein
the outer branch part includes a first side adjacent to the storage electrode line and a second side connected to the minute branches, and
a distance between the second side of the outer branch part and the storage electrode line gradually decreases from the center part of the outer branch part toward the edge part.

11. The display device of claim 10, wherein
a distance between the first side of the outer branch part and the storage electrode line is uniform.

12. The display device of claim 6, further comprising
a dummy branch part disposed between the outer branch part and the storage electrode line,
a width of the dummy branch part is uniform, and
the dummy branch part and the outer branch part are extended to be parallel.

13. The display device of claim 12, wherein
the outer branch part includes a first side adjacent to the storage electrode line and a second side connected to the minute branches, and
a distance between the first side of the outer branch part and the storage electrode line gradually increases from the center part of the outer branch part toward the edge part of the outer branch part.

14. The display device of claim 13, wherein
a distance between the second side of the outer branch part and the storage electrode line is uniform.

15. The display device of claim 13, wherein
a distance between the second side of the outer branch part and the storage electrode line gradually decreases from the center part of the outer branch part toward the edge part of the outer branch part.

16. The display device of claim 12, wherein
the outer branch part includes a first side adjacent to the storage electrode line and a second side connected to the minute branches, and
a distance between the second side of the outer branch part and the storage electrode line gradually decreases from the center part of the outer branch part toward the edge part of the outer branch part.

17. The display device of claim 16, wherein
a distance between the first side of the outer branch part and the storage electrode line is uniform.

18. A display device comprising:
a substrate;
a first wiring and a second wiring disposed on the substrate;
a thin film transistor connected to the first wiring and the second wiring; and
a pixel electrode which is connected to the thin film transistor and includes:
a transverse branch part;
a longitudinal branch part;
minute branches extending from the transverse branch part and the longitudinal branch part;
an outer branch part connecting end parts of the minute branches; and
a storage electrode line adjacent to the outer branch part of the pixel electrode,
wherein
a width of the storage electrode line gradually increases from a center part of the storage electrode line toward an edge part of the storage electrode line.

19. The display device of claim 18, wherein
a width of the outer branch part gradually decreases from the center part of the outer branch part toward the edge part of the outer branch part.

20. The display device of claim 19, wherein
a distance between the outer branch part and the storage electrode line is uniform.

21. A display device comprising:
a substrate;
a first wiring and a second wiring disposed on the substrate;
a thin film transistor connected to the first wiring and the second wiring; and
a pixel electrode which is connected to the thin film transistor and includes:
a transverse branch part;
a longitudinal branch part;
minute branches extending from the transverse branch part and the longitudinal branch part;
an outer branch part connecting end parts of the minute branches; and
a storage electrode line adjacent to the outer branch part of the pixel electrode,
wherein
a width of the outer branch part is uniform, and
a width of the storage electrode line gradually increases from a center part of the storage electrode line toward an edge part of the storage electrode line.

22. The display device of claim 21, wherein
a distance between the outer branch part and the storage electrode line is uniform.

23. The display device of claim 1, further comprising
a storage electrode line adjacent to the outer branch part of the pixel electrode,
wherein
a width of the outer branch part is uniform, and
a width of the storage electrode line is uniform.

24. The display device of claim 23, wherein
a distance between the outer branch part and the storage electrode line gradually increases from the center part of the outer branch part toward the edge part of the outer branch part.

* * * * *